United States Patent
Nagashima et al.

(10) Patent No.: US 9,299,303 B2
(45) Date of Patent: Mar. 29, 2016

(54) LIQUID CRYSTAL DISPLAY DEVICE

(71) Applicants: Osamu Nagashima, Mobara (JP); Takahiro Nagami, Mobara (JP)

(72) Inventors: Osamu Nagashima, Mobara (JP); Takahiro Nagami, Mobara (JP)

(73) Assignees: Japan Display Inc., Tokyo (JP); Panasonic Liquid Crystal Display Co., LTD, Hyogo-Ken (JP)

( * ) Notice: Subject to any disclaimer, the term of this patent is extended or adjusted under 35 U.S.C. 154(b) by 268 days.

(21) Appl. No.: 14/140,241

(22) Filed: Dec. 24, 2013

(65) Prior Publication Data

US 2014/0104150 A1 Apr. 17, 2014

Related U.S. Application Data

(63) Continuation of application No. 12/773,098, filed on May 4, 2010, now Pat. No. 8,665,192.

(30) Foreign Application Priority Data

Jul. 8, 2009 (JP) .................................. 2009-161355
Sep. 30, 2009 (JP) .................................. 2009-227362

(51) Int. Cl.
G09G 3/36 (2006.01)
H01L 27/12 (2006.01)
G02F 1/1362 (2006.01)
H01L 27/32 (2006.01)

(52) U.S. Cl.
CPC ............ *G09G 3/3655* (2013.01); *G02F 1/1362* (2013.01); *H01L 27/124* (2013.01); *H01L 27/1214* (2013.01); *G02F 1/136286* (2013.01); *G09G 3/3607* (2013.01); *G09G 2300/0426* (2013.01); *H01L 27/3248* (2013.01); *H01L 27/3262* (2013.01); *H01L 27/3265* (2013.01)

(58) Field of Classification Search
CPC .............. H01L 27/124; H01L 27/1214; H01L 27/3262; H01L 27/3248; H01L 27/3265; G09G 3/3607; G09G 2300/0426
See application file for complete search history.

(56) References Cited

U.S. PATENT DOCUMENTS

| | | | | |
|---|---|---|---|---|
| 5,151,689 | A * | 9/1992 | Kabuto | G02F 1/1345 345/103 |
| 6,292,237 | B1 * | 9/2001 | Hebiguchi | G02F 1/136213 349/141 |
| 7,808,494 | B2 | 10/2010 | Lee et al. | |
| 8,179,350 | B2 | 5/2012 | Park et al. | |

(Continued)

FOREIGN PATENT DOCUMENTS

| | | |
|---|---|---|
| JP | 62-223727 | 10/1987 |
| JP | 2-42420 | 2/1990 |

(Continued)

*Primary Examiner* — Michael J Eurice
(74) *Attorney, Agent, or Firm* — Typha IP LLC

(57) ABSTRACT

A display device includes a first gate signal line and a second gate signal line, and a first drain signal line, a second drain signal line, and a third drain signal line. A first pixel and a second pixel are surrounded by the first gate signal line, the second gate signal line, the first drain signal line, and the second drain signal line, and a third pixel and a fourth pixel are surrounded by the first gate signal line, the second gate signal line, the second drain signal line, and the third drain signal line. A first storage line and a second storage line are disposed between the first gate signal line and the second gate signal line, and the first pixel includes a first thin film transistor connected to the first gate signal line, the first drain signal line, and a first pixel electrode of the first pixel.

20 Claims, 11 Drawing Sheets

(56) References Cited

U.S. PATENT DOCUMENTS

| | | | | |
|---|---|---|---|---|
| 2002/0154079 | A1* | 10/2002 | Shiota | G02F 1/134363 345/87 |
| 2002/0196389 | A1* | 12/2002 | Koyama | G09G 3/3275 349/69 |
| 2005/0231455 | A1* | 10/2005 | Moon | G09G 3/3648 345/89 |
| 2006/0081850 | A1* | 4/2006 | Lee | G02F 1/136286 257/72 |
| 2006/0120160 | A1* | 6/2006 | Park | G02F 1/1368 365/185.22 |
| 2006/0209245 | A1* | 9/2006 | Mun | G02F 1/133707 349/155 |
| 2006/0256248 | A1* | 11/2006 | Baek | G02F 1/136286 349/42 |
| 2006/0290826 | A1* | 12/2006 | Paik | G02F 1/136213 349/38 |
| 2007/0052902 | A1* | 3/2007 | Yoo | G02F 1/13624 349/144 |
| 2008/0129907 | A1* | 6/2008 | Jun | G02F 1/13624 349/38 |
| 2008/0231569 | A1* | 9/2008 | Yamazaki | G09G 3/3614 345/84 |

FOREIGN PATENT DOCUMENTS

| | | |
|---|---|---|
| JP | 09-146118 | 6/1997 |
| JP | 09-325358 | 12/1997 |
| JP | 2005-309437 | 11/2005 |
| JP | 2006-79104 | 3/2006 |
| JP | 2006-106745 | 4/2006 |
| WO | WO 2008/087764 | 7/2008 |

* cited by examiner

LIQUID CRYSTAL DISPLAY DEVICE

CROSS-REFERENCE TO RELATED APPLICATION

This application is a continuation of U.S. application Ser. No. 12/773,098, filed May 4, 2010, the contents of which are incorporated herein by reference.

The present application claims priority from Japanese application JP 2009-161355 filed on Jul. 8, 2009 and Japanese application JP 2009-227362 filed on Sep. 30, 2009, the content of which is hereby incorporated by reference into this application.

BACKGROUND OF THE INVENTION

1. Field of the Invention

The present invention relates to a liquid crystal display device and more particularly to a so-called dual gate drive liquid crystal display device.

2. Description of the Related Art

The so-called dual gate drive liquid crystal display device is disclosed in, for example, JP-A-2-42420 (corresponding to U.S. Pat. No. 5,151,689).

The liquid crystal display device described above is configured such that in a pixel group of pixels arranged in a row direction among pixels disposed in a matrix for example, pixels which are alternately disposed (for example, odd-numbered pixels) are selected by a gate signal line (sometimes referred to as first gate signal line) formed on one side of the pixel group, and the other pixels (even-numbered pixels) are selected by a gate signal line (sometimes referred to as second gate signal line) formed on the other side of the pixel group.

Each of drain signal lines is disposed so as to run between the odd-numbered pixel and the even-numbered pixel adjacent to each other and is not disposed between the even-numbered pixel and the odd-numbered pixel adjacent to each other. Each of the drain signal lines supplies a video signal to the odd-numbered pixel adjacent to the drain signal line when the odd-numbered pixel is selected by the first gate signal line. The drain signal line supplies a video signal to the even-numbered pixel adjacent to the drain signal line when the even-numbered pixel is selected by the second gate signal line. That is, one drain signal line can supply a video signal to both the odd-numbered pixel and the even-numbered pixel disposed on both sides of the drain signal line.

Accordingly, the thus configured liquid crystal display device has an advantage in that the number of drain signal lines for supplying a video signal to the pixels can be reduced to a half that of a conventional one.

For example, JP-A-62-223727 discloses a related art of the invention. This describes a configuration in which a pair of drain signal lines run on both sides of a pixel and in a pixel electrode which is formed on the pixel region of an insulating film formed so as to cover the drain signal lines, sides of the pixel electrode on the drain signal line side are formed so as to overlap with the drain signal lines in a plan view.

SUMMARY OF THE INVENTION

The liquid crystal display device shown in JP-A-2-42420 (corresponding to U.S. Pat. No. 5,151,689) is of a so-called vertical electric field type in which pixel electrodes formed of a translucent conductive film are formed on a substrate (sometimes referred to as first substrate) having gate signal lines and drain signal lines formed thereon, and pixel electrodes formed of a translucent conductive film are formed on a substrate (sometimes referred to as second substrate) which faces the first substrate via liquid crystal.

In the dual gate drive liquid crystal display device of the vertical electric field type, when attempting to improve the aperture ratio of each pixel, it is found that there is a limit in improvement of the aperture ratio. That is, the dual gate drive liquid crystal display device has the configuration in which the drain signal line is not formed between the even-numbered pixel and the odd-numbered pixel adjacent to each other in the pixels arranged in a row direction, for example, as described above. Therefore, for blocking light between the even-numbered pixel and the odd-numbered pixel adjacent to each other, a black matrix (light shielding film) is formed on the second substrate side. However, the width of the black matrix corresponding to the space between the even-numbered pixel and the odd-numbered pixel has to be increased. Moreover, when the second substrate is disposed so as to face the first substrate, it is necessary to design the width of the black matrix with an allowance in view of the misalignment between the substrates. This means that the aperture ratio of each pixel is limited by the black matrix.

It is an object of the invention to provide a liquid crystal display device having an improved aperture ratio.

A liquid crystal display device of the invention includes a storage line that forms a capacitive element between a pixel electrode and the storage line. The storage line is disposed in each pixel on the side where a drain signal line is not disposed, so that the storage line has a function of a light shielding film.

Another liquid crystal display device of the invention uses the storage line newly formed as described above to form a capacitive element, thereby reducing the occupancy area of a capacitive element conventionally provided therein. As a result, the region of the pixel is increased to improve the aperture ratio.

The invention can be configured as follows, for example.

(1) A liquid crystal display device of the invention includes: in each of a plurality of pixels on a substrate, a thin film transistor controlled by a scanning signal from a gate signal line; a pixel electrode supplied with a video signal from a drain signal line through the thin film transistor; and a capacitive element formed between the pixel electrode and a storage line, wherein a plurality of pixel groups each of which has a first pixel, a second pixel, a third pixel, and a fourth pixel repeatedly disposed in this order in a first direction are disposed along a second direction crossing the first direction, the gate signal line includes a first gate signal line and a second gate signal line between the pixel groups, each of the thin film transistors of the first pixel and the third pixel is controlled by a scanning signal from the first gate signal line, each of the thin film transistors of the second pixel and the fourth pixel is controlled by a scanning signal from the second gate signal line, the drain signal line includes a first drain signal line disposed between the fourth pixel and the first pixel and supplying a video signal to the fourth pixel and the first pixel and a second drain signal line disposed between the second pixel and the third pixel and supplying a video signal to the second pixel and the third pixel, the storage line includes a first storage line adjacent to the first gate signal line, a second storage line adjacent to the second gate signal line, a third storage line disposed between the first pixel and the second pixel and electrically connected to the first storage line and the second storage line, and a fourth storage line disposed between the third pixel and the fourth pixel and electrically connected to the first storage line and the second storage line, and the pixel electrode has a portion overlapping with the drain signal line and a portion overlapping with the storage line.

(2) According to the liquid crystal display device of the invention, in (1), the first storage line has a region with a wide width in a portion thereof close to the thin film transistor, and the second storage line has a region with a wide width in a portion thereof close to the thin film transistor.

(3) According to the liquid crystal display device of the invention, in (1), a protective film formed of an organic insulating film is formed above the substrate so as to cover the thin film transistor, and the pixel electrode is formed on the upper surface of the protective film.

(4) According to the liquid crystal display device of the invention, in (1), when the pixel group that has the first pixel, the second pixel, the third pixel, and the fourth pixel repeatedly disposed in this order is defined as a first pixel group, and another pixel group disposed adjacent to the first pixel group is defined as a second pixel group, the second pixel group is disposed so as to shift from the first pixel group by a half pitch of the pixel, and the drain signal line is formed with a bent portion in a region between the first pixel group and the second pixel group.

(5) According to the liquid crystal display device of the invention, in (1), when the pixel group that has the first pixel, the second pixel, the third pixel, and the fourth pixel repeatedly disposed in this order is defined as a first pixel group, and another pixel group disposed adjacent to the first pixel group is defined as a second pixel group, the second pixel group is disposed so as not to shift from the first pixel group, and the drain signal line is formed without having a bent portion in a region between the first pixel group and the second pixel group.

(6) A liquid crystal display device of the invention includes: in each of a plurality of pixels on a substrate, a thin film transistor controlled by a scanning signal from a gate signal line; a pixel electrode supplied with a video signal from a drain signal line through the thin film transistor; and a capacitive element formed between the pixel electrode and a storage line, wherein a plurality of pixel groups each of which has a first pixel, a second pixel, a third pixel, and a fourth pixel repeatedly disposed in this order in a first direction are disposed along a second direction crossing the first direction, the gate signal line includes a first gate signal line and a second gate signal line between the pixel groups, each of the thin film transistors of the first pixel and the fourth pixel is controlled by a signal from the first gate signal line, each of the thin film transistors of the second pixel and the third pixel is controlled by a signal from the second gate signal line, the drain signal line has a first drain signal line disposed between the fourth pixel and the first pixel and supplying a video signal to the fourth pixel and the first pixel and a second drain signal line disposed between the second pixel and the third pixel and supplying a video signal to the second pixel and the third pixel, the storage line includes a first storage line and a second storage line disposed so as to interpose the pixel group therebetween, a third storage line disposed between the first pixel and the second pixel and electrically connected to the first storage line and the second storage line, and a fourth storage line disposed between the third pixel and the fourth pixel and electrically connected to the first storage line and the second storage line, and the pixel electrode has a first side extending in the second direction and having a portion overlapping with the drain signal line and a second side extending in the second direction and having a portion overlapping with the storage line.

(7) According to the liquid crystal display device of the invention, in (6), the first storage line has a region with a wide width in the first pixel and the fourth pixel, the region constituting one of electrodes of the capacitive element, and the second storage line has a region with a wide width in the second pixel and the third pixel, the region constituting one of electrodes of the capacitive element of the pixels.

(8) According to the liquid crystal display device of the invention, in (6), a protective film formed of an organic insulating film is formed above the substrate so as to cover the thin film transistor, and the pixel electrode is formed on the upper surface of the protective film.

(9) According to the liquid crystal display device of the invention, in (6), when the pixel group that has the first pixel, the second pixel, the third pixel, and the fourth pixel repeatedly disposed in this order is defined as a first pixel group, and another pixel group disposed adjacent to the first pixel group is defined as a second pixel group, the second pixel group is disposed so as to shift from the first pixel group by a half pitch of the pixel, and the drain signal line is formed with a bent portion in a region between the first pixel group and the second pixel group.

(10) According to the liquid crystal display device of the invention, in (6), when the pixel group that has the first pixel, the second pixel, the third pixel, and the fourth pixel repeatedly disposed in this order is defined as a first pixel group, and another pixel group disposed adjacent to the first pixel group is defined as a second pixel group, the second pixel group is disposed so as not to shift from the first pixel group, and the drain signal line is formed without having a bent portion in a region between the first pixel group and the second pixel group.

(11) A liquid crystal display device of the invention includes: in each of a plurality of pixels on a substrate, a thin film transistor turned on by a scanning signal from a gate signal line; a pixel electrode supplied with a video signal from a drain signal line through the turned-on thin film transistor; a capacitive element formed between the pixel electrode and a storage line, the capacitive element being in a different layer from the pixel electrode and being electrically connected with the pixel electrode; and an intermediate electrode having a portion overlapping with the storage line in a plan view, wherein in a pixel group having a first pixel and a second pixel repeatedly disposed in this order in a first direction, the gate signal line has a pair of first gate signal line and second gate signal line that run with the pixel group therebetween, the thin film transistor of the first pixel is turned on by a scanning signal from the first gate signal line, the thin film transistor of the second pixel is turned on by a scanning signal from the second gate signal line, the drain signal line runs between the first pixel and a second pixel adjacent to the first pixel in a second direction that is an opposite direction from the first direction and supplies a video signal to each of pixel electrodes of the first pixel and the second pixel positioned on both sides of the drain signal line, the storage line has a first storage line adjacent to the first gate signal line and formed along the first gate signal line, a second storage line adjacent to the second gate signal line and formed along the second gate signal line, and a third storage line running between the first pixel and the second pixel adjacent to the first pixel in the first direction and is electrically connected to the first storage line and the second storage line, the thin film transistor and the intermediate electrode are disposed on the side of the first gate signal line in the first pixel and disposed on the side of the second gate signal line in the second pixel, the pixel electrode has, in the first pixel, a side adjacent to the third storage line and having a portion overlapping with the third storage line and has, in the second pixel, a side adjacent to the third storage line and having a portion overlapping with the third storage line, the intermediate electrode has, in the first pixel, a first extended portion extending along the third storage line so as to have a portion overlapping with a side of the third storage line on the first pixel side and a second extended portion electrically connected with the first extended portion and extending so as to have a portion overlapping with the second storage line, and has, in the second pixel, a first extended portion extending along the third storage line so as to have a portion overlapping with a side of the third storage line on the second pixel side and a second extended portion electrically connected with the first extended portion and extending so as to have a portion overlapping with the first storage line.

(12) According to the liquid crystal display device of the invention, in (11), the pixel electrode has a side adjacent to the drain signal line and having a portion overlapping with the drain signal line in the first pixel and the second pixel.

(13) According to the liquid crystal display device of the invention, in any of (11) and (12), a protective film formed of an organic insulating film is formed above the substrate so as to cover the thin film transistor, and the pixel electrode is formed on the upper surface of the protective film.

(14) According to the liquid crystal display device of the invention, in (11), when the pixel group having the first pixel and the second pixel repeatedly disposed in this order is defined as a first pixel group, and another pixel group disposed adjacent to the first pixel group is defined as a second pixel group, the second pixel group is disposed so as to shift from the first pixel group by a half pitch of the pixel, and the drain signal line is formed with a bent portion in a region between the first pixel group and the second pixel group.

(15) A liquid crystal display device of the invention includes: in each of a plurality of pixels on a substrate, a thin film transistor turned on by a scanning signal from a gate signal line; a pixel electrode supplied with a video signal from a drain signal line through the turned-on thin film transistor; a capacitive element formed between the pixel electrode and a storage line, the capacitive element being in a different layer from the pixel electrode and being electrically connected with the pixel electrode; and an intermediate electrode having a portion overlapping with the storage line in a plan view, wherein in a pixel group having a first pixel and a second pixel repeatedly disposed in this order in a first direction, the gate signal line has a pair of first gate signal line and second gate signal line running with the pixel group therebetween, the thin film transistor of the first pixel is turned on by a scanning signal from the first gate signal line, the thin film transistor of the second pixel is turned on by a scanning signal from the second gate signal line, the drain signal line runs between the first pixel and a second pixel adjacent to the first pixel in a second direction that is an opposite direction from the first direction and supplies a video signal to each of pixel electrodes of the first pixel and the second pixel positioned on both sides thereof, the storage line has a first storage line adjacent to the first gate signal line and formed along the first gate signal line, a second storage line adjacent to the second gate signal line and formed along the second gate signal line, and a third storage line running between the first pixel and the second pixel adjacent to the first pixel in the first direction and is electrically connected to the first storage line and the second storage line, the thin film transistor and the intermediate electrode are disposed on the side of the first gate signal line in the first pixel and disposed on the side of the second gate signal line in the second pixel, the pixel electrode has, in the first pixel, a side adjacent to the third storage line and having a portion overlapping with the third storage line and has, in the second pixel, a side adjacent to the third storage line and having a portion overlapping with the third storage line, the intermediate electrode has, in the first pixel, a first extended portion extending along the third storage line so as to have a portion overlapping with a side of the third storage line on the first pixel side and a second extended portion extending so as to have a portion overlapping with the first storage line formed in the second pixel adjacent to the first pixel in the first direction, and has, in the second pixel, a first extended portion extending along the third storage line so as to have a portion overlapping with a side of the third storage line on the second pixel side and a second extended portion extending so as to have a portion overlapping with the second storage line formed in the first pixel adjacent to the second pixel in the second direction.

(16) According to the liquid crystal display device of the invention, in (15), the pixel electrode has a side adjacent to the drain signal line and having a portion overlapping with the drain signal line in the first pixel and the second pixel.

(17) According to the liquid crystal display device of the invention, in any of (15) and (16), a protective film formed of an organic insulating film is formed above the substrate so as to cover the thin film transistor, and the pixel electrode is formed on the upper surface of the protective film.

(18) According to the liquid crystal display device of the invention, in (15), when the pixel group having the first pixel and the second pixel repeatedly disposed in this order is defined as a first pixel group, and another pixel group disposed adjacent to the first pixel group is defined as a second pixel group, the second pixel group is disposed so as to shift from the first pixel group by a half pitch of the pixel, and the drain signal line is formed with a bent portion in a region between the first pixel group and the second pixel group.

The above-described configurations are illustrative only, and the invention can be modified appropriately within a range not departing from the technical idea thereof. Exemplary configurations of the invention other than the above-described configurations will become apparent from the entire description of the specification and the drawings.

According to the liquid crystal display device described above, the aperture ratio can be improved.

Other advantages of the invention will become apparent from the entire description of the specification.

DESCRIPTION OF THE PREFERRED EMBODIMENTS

Figure 1:
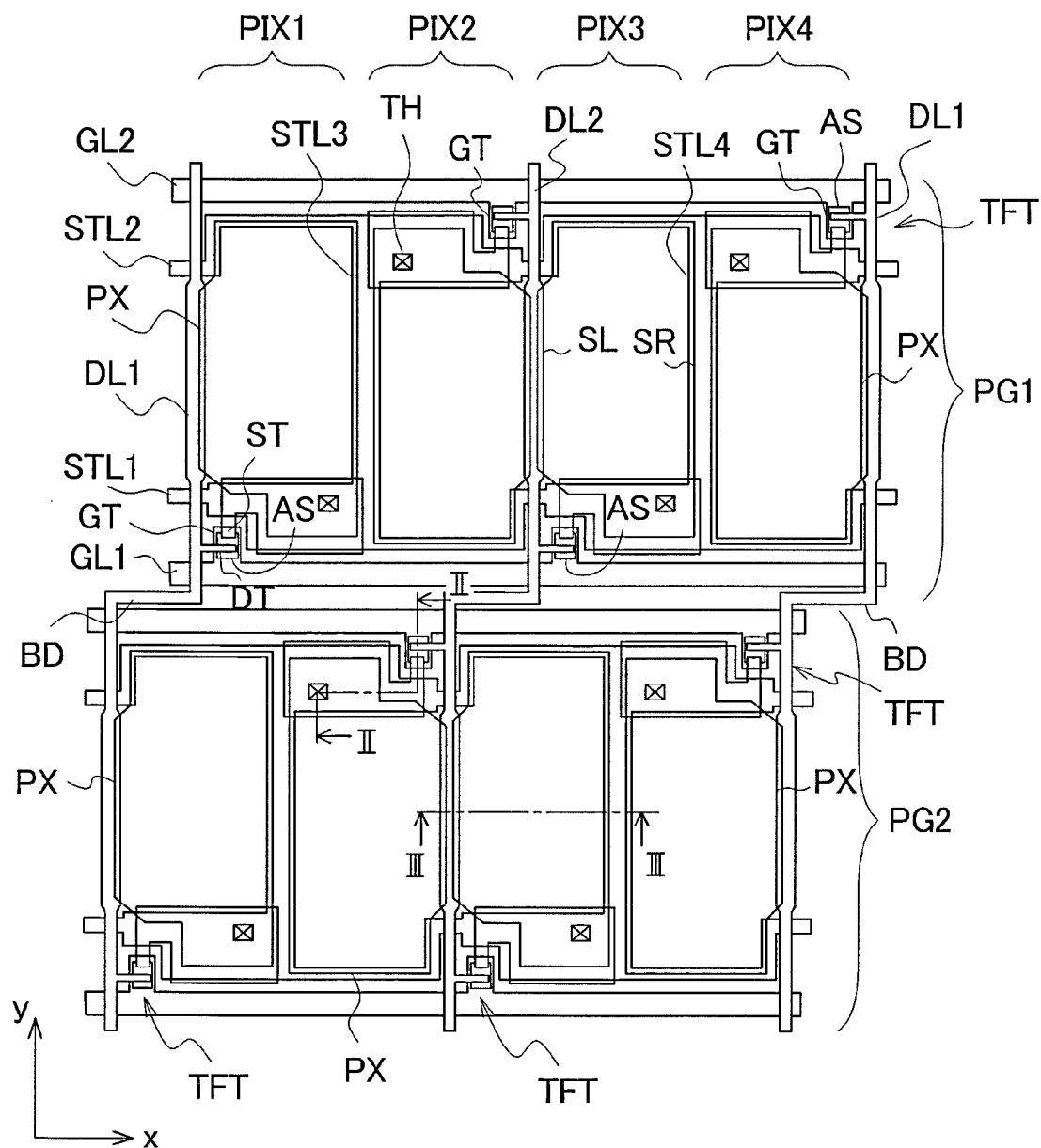
FIG. 1 is a plan view showing a first embodiment of pixels of a liquid crystal display device of the invention.

Embodiments of the invention will be described with reference to the drawings. In the drawings and embodiments, the same reference numerals and signs are assigned to the same or similar constituents, and the description thereof is omitted.

[First Embodiment]

Figure 2:
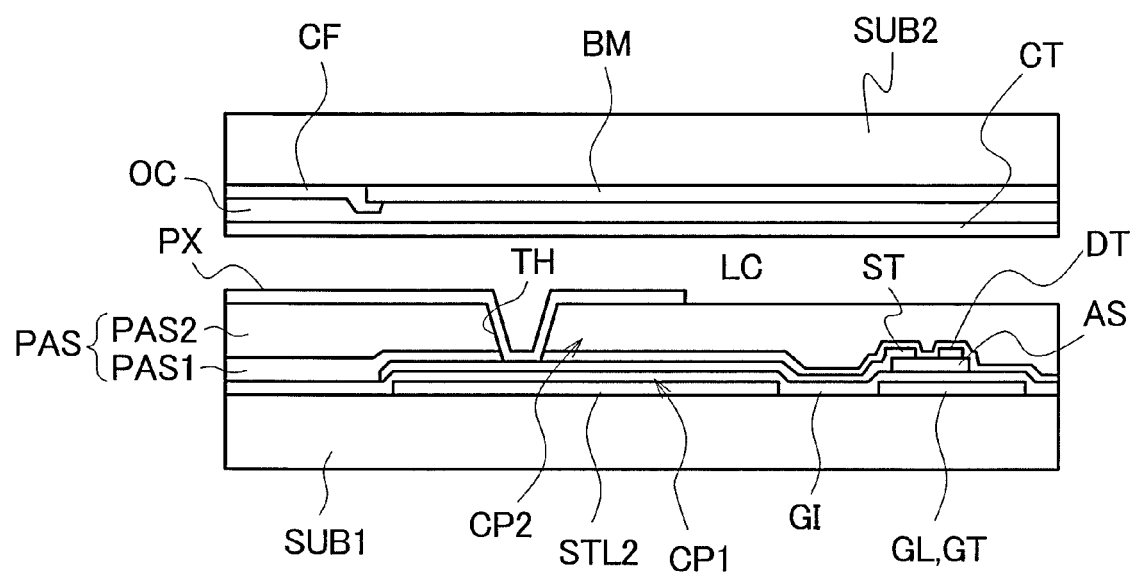
FIG. 2 is a cross-sectional view taken along line II-II of FIG. 1.
Figure 3:
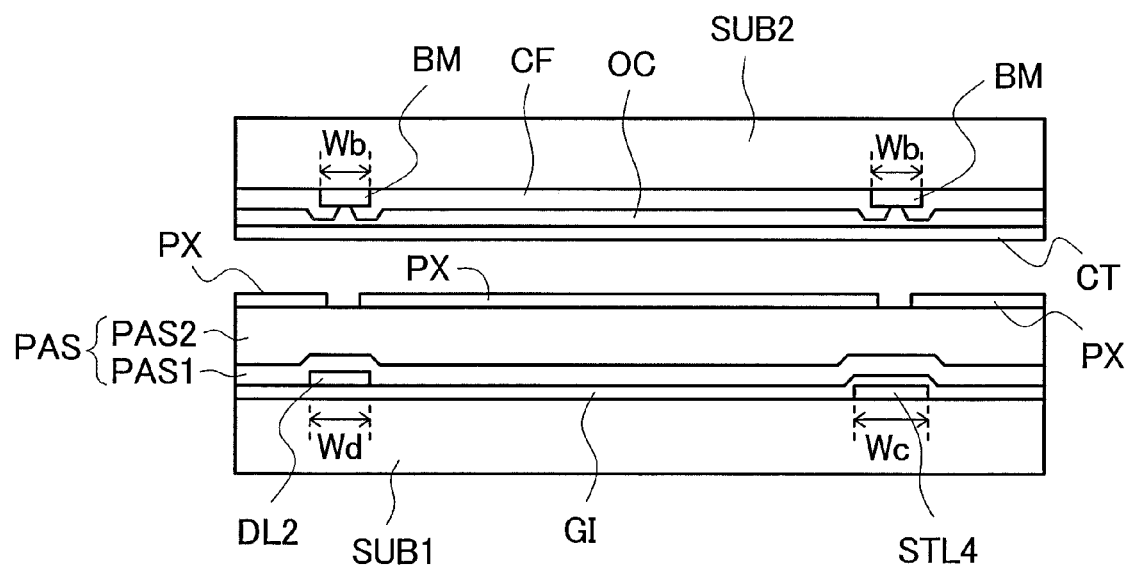
FIG. 3 is a cross-sectional view taken along line III-III of FIG. 1.

FIG. 1 is a plan view showing a first embodiment of pixels of a liquid crystal display device of the invention. FIG. 1 shows pixels formed on a face of one substrate (first substrate SUB1) of a pair of substrates, which are disposed so as to face each other with liquid crystal interposed therebetween, on the liquid crystal side. FIG. 1 shows only a part of the pixels, which are disposed in a matrix including pixel columns and pixel rows. FIG. 2 shows a cross-sectional view taken along line II-II of FIG. 1 together with the other substrate (second substrate SUB2). FIG. 3 shows a cross-sectional view taken along line III-III FIG. 1 together with the other substrate SUB2.

In FIG. 1, among the plurality of pixels disposed in an image display region, a pixel group (first pixel group PG1) formed of four pixels disposed in a row direction (x-direction in the drawing) and a pixel group (second pixel group PG2) formed of another four pixels disposed adjacent to the first pixel group PG1 in a column direction (y-direction in the drawing) are shown. For the convenience of description, the respective pixels of the first pixel group PG1 are referred to as first pixel PIX1, second pixel PIX2, third pixel PIX3, and fourth pixel PIX4 from the left in the drawing. Actually in the first pixel group PG1, the first pixel PIX1, the second pixel PIX2, the third pixel PIX3, and the fourth pixel PIX4 are repeatedly disposed in this order in the x-direction in the drawing. The pixel row includes the plurality of pixel groups arranged in parallel in the x-direction. The same applies to the second pixel group PG2.

Figure 4:
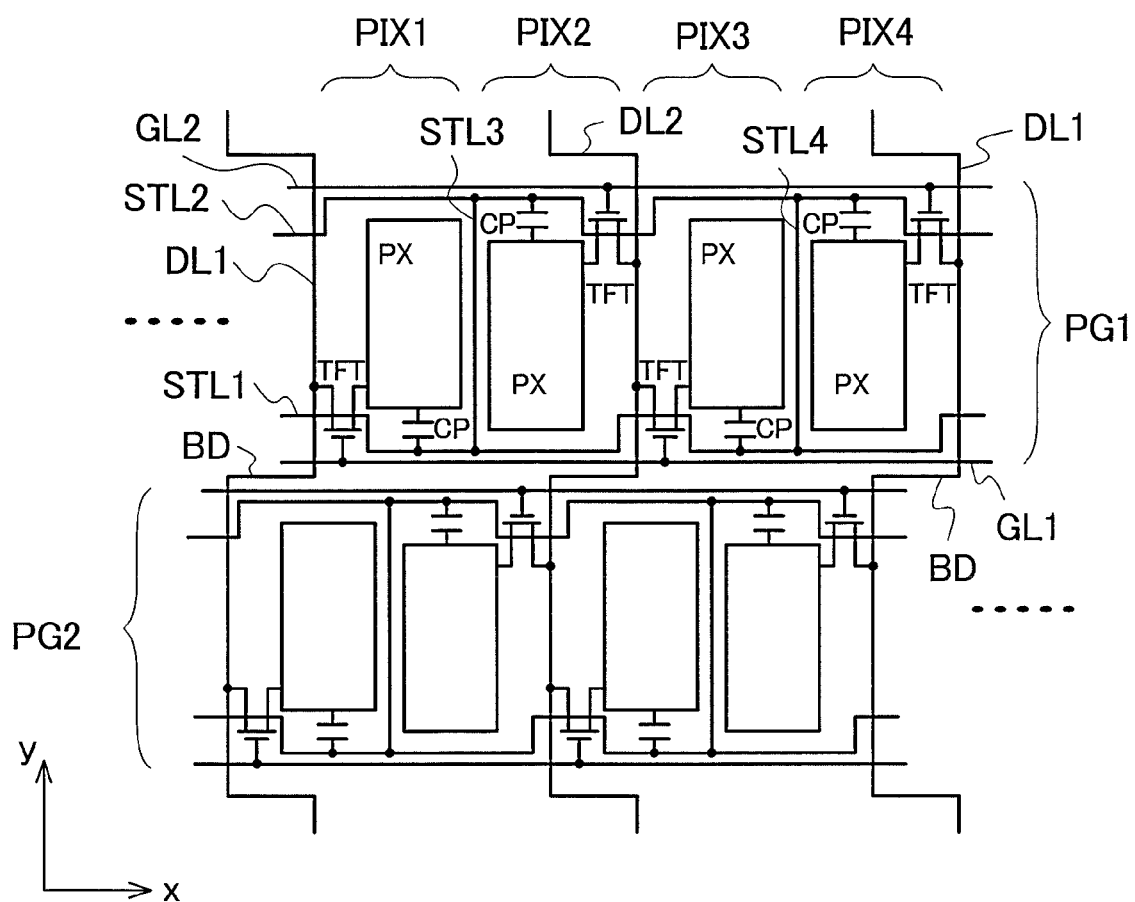
FIG. 4 is an equivalent circuit diagram geometrically illustrating the pixels shown in FIG. 1.

Before describing FIG. 1, the outline will be described by using an equivalent circuit of FIG. 4 that corresponds to FIG. 1. In FIG. 4, the first pixel group PG1 has a pair of first gate signal line GL (indicated by reference sign GL1 in the drawing) and second gate signal line GL (indicated by reference sign GL2 in the drawing) that run in the x-direction in the drawing with the first pixel group PG1 therebetween. Each of thin film transistors TFT of the first pixel PIX1 and the third pixel PIX3 is controlled by a scanning signal from the first gate signal line GL1. Each of thin film transistors TFT of the second pixel PIX2 and the fourth pixel PIX4 is controlled by a scanning signal from the second gate signal line GL2. In view of this, each of the thin film transistors TFT of the first pixel PIX1 and the third pixel PIX3 is disposed adjacent to the first gate signal line GL1, and each of the thin film transistors TFT of the second pixel PIX2 and the fourth pixel PIX4 is disposed adjacent to the second gate signal line GL2. A first drain signal line DL (indicated by reference sign DL1 in the drawing) runs between the fourth pixel PIX4 and the first pixel PIX1. A video signal from the first drain signal line DL1 is supplied to a pixel electrode PX in the first pixel PIX1 through the thin film transistor TFT and supplied to a pixel electrode PX in the fourth pixel PIX4 through the thin film transistor TFT. A second drain signal line DL (indicated by reference sign DL2 in the drawing) runs between the second pixel PIX2 and the third pixel PIX3. A video signal from the second drain signal line DL2 is supplied to a pixel electrode PX in the second pixel PIX2 through the thin film transistor TFT and supplied to a pixel electrode PX in the third pixel PIX3 through the thin film transistor TFT.

In the first pixel group PG1, a first storage line STL (indicated by reference sign STL1 in the drawing) that is adjacent to the first gate signal line GL1 and formed along the first gate signal line GL1 and a second storage line STL (indicated by reference sign STL2 in the drawing) that is adjacent to the second gate signal line GL2 and formed along the second gate signal line GL2 are provided. The first storage line STL1 forms a capacitive element CP between the first storage line STL1 and the pixel electrode PX in the first pixel PIX1 and forms a capacitive element CP between the first storage line STL1 and the pixel electrode PX in the third pixel PIX3. In the embodiment, a third storage line STL (indicated by reference sign STL3 in the drawing) that runs between the first pixel PIX1 and the second pixel PIX2 and is electrically connected to the first storage line STL1 and the second storage line STL2 and a fourth storage line STL (indicated by reference sign STL4 in the drawing) that runs between the third pixel PIX3 and the fourth pixel PIX4 and is electrically connected to the first storage line STL1 and the second storage line STL2 are newly provided. Advantages of the third storage line STL3 and the fourth storage line STL4 will be described later.

In the embodiment, two gate signal lines and two storage lines are disposed for one pixel row. Each of the pixels in the pixel row is connected to one of the gate signal lines. Moreover, two pixel columns are connected to one drain signal line. The two storage lines extend in an extending direction of the gate signal line and are connected to each other in a region where the drain signal line is not disposed.

To the thus configured first pixel group PG1, the second pixel group PG2 is disposed in an arrangement direction of the plurality of pixel rows (the y-direction in the drawing). A first pixel PIX1, a second pixel PIX2, a third pixel PIX3, and a fourth pixel PIX4 in the second pixel group PG2 have the same configuration as that of the first pixel PIX1, the second pixel PIX2, the third pixel PIX3, and the fourth pixel PIX4 in the first pixel group PG1, respectively. In the embodiment, the second pixel group PG2 is disposed so as to shift from the first pixel group PG1 in the x-direction in the drawing by a half pitch of the pixel. Therefore, the first drain signal line DL1 and the second drain signal line DL2 in the first pixel group PG1 are respectively connected to the corresponding first drain signal line DL1 and the corresponding second drain signal line DL2 in the second pixel group PG2 with a bent portion BD in a region between the first pixel group PG1 and the second pixel group PG2. Although not shown in the drawing, also a pixel group disposed at the upper side in the drawing is disposed so as to shift from the first pixel group PG1 in the x-direction by a half pitch of the pixel. That is, the pixel group at the upper side of the first pixel group is arranged in the same manner as the second pixel group PG2.

Returning to FIG. 1, on the face (surface) of the first substrate SUB1 (refer to FIGS. 2 and 3) on the liquid crystal side, the first gate signal line GL1, the second gate signal line GL2, the first storage line STL1, and the second storage line STL2 are formed. The first gate signal line GL1, the second gate signal line GL2, the first storage line STL1, and the second storage line STL2 are formed of a lightproof material such as metal, for example, and formed simultaneously, for example.

The first gate signal line GL1 has a protruding portion formed so as to protrude toward the center side of the pixel in regions of the first pixel PIX1 and the third pixel PIX3. The protruding portion constitutes a gate electrode GT of the thin film transistor TFT in the first pixel PIX1 and the third pixel PIX3. Similarly, the second gate signal line GL2 has a protruding portion formed so as to protrude toward the center side of the pixel in the second pixel PIX2 and the fourth pixel PIX4. The protruding portion constitutes a gate electrode GT of the thin film transistor TFT in the second pixel PIX2 and the fourth pixel PIX4.

The first storage line STL1 is formed wide in the regions of the first pixel PIX1 and the third pixel PIX3 to constitute one of electrodes of the capacitive element CP in the first pixel PIX1 and the third pixel PIX3. Similarly, the second storage line STL2 is formed wide in the regions of the second pixel PIX2 and the fourth pixel PIX4 to constitute one of electrodes of the capacitive element CP in the second pixel PIX2 and the fourth pixel PIX4.

The first storage line STL1 and the second storage line STL2 are electrically connected to each other with the third storage line STL3 formed between the first pixel PIX1 and the second pixel PIX2 and electrically connected to each other with the fourth storage line STL4 formed between the third pixel PIX3 and the fourth pixel PIX4. The third storage line STL3 and the fourth storage line STL4 are formed in a portion where the drain signal line DL (DL1 and DL2), described later, does not run. With this configuration, each of the first pixel PIX1, the second pixel PIX2, the third pixel PIX3, and the fourth pixel PIX4 is disposed between the drain signal line DL and the storage line STL.

On the surface of the first substrate SUB1, an insulating film GI (refer to FIGS. 2 and 3) formed of a silicon oxide film, for example, is formed so as to cover the first gate signal line GL1, the second gate signal line GL2, the first storage line STL1, and the second storage line STL2. The insulating film GI functions as a gate insulating film in the forming region of the thin film transistor TFT described later.

An island-like semiconductor layer AS formed of amorphous silicon, for example, is formed on the upper surface of the insulating film GI at a portion where the semiconductor layer overlaps with the gate electrode GT. The semiconductor layer AS serves as a semiconductor layer of a MIS (Metal Insulator Semiconductor) type thin film transistor TFT, and a drain electrode DT and a source electrode ST that are disposed to face each other are formed on the upper surface of the semiconductor layer. In the first pixel PIX1, a part of the first drain signal line DL1 that runs between the fourth pixel PIX4 and the first pixel PIX1 is extended to constitute the drain electrode DT of the thin film transistor TFT. In the second pixel PIX2, a part of the second drain signal line DL2 that runs between the second pixel PIX2 and the third pixel PIX3 is extended to constitute a drain electrode DT of the thin film transistor TFT. In the third pixel PIX3, a part of the second drain signal line DL2 is extended to constitute a drain electrode DT of the thin film transistor TFT. In the fourth pixel PIX4, a part of the first drain signal line DL1 is extended to constitute a drain electrode DT of the thin film transistor TFT.

Each of the source electrodes ST of the thin film transistors TFT in the first pixel PIX1, the second pixel PIX2, the third pixel PIX3, and the fourth pixel PIX4 is formed simultaneously when the first drain signal line DL1 and the second drain signal line DL2 are formed, and its extended portion is formed to have a large area in each of the pixels and formed so as to overlap with the one electrode (portion where the width of the storage line STL is made large) of the capacitive element CP. With this configuration, a first capacitive element CP1 (refer to FIG. 2) is formed between the storage line STL and the source electrode ST with the insulating film GI being as a dielectric film.

On the surface of the first substrate SUB1, a protective film PAS (refer to FIGS. 2 and 3) that is formed of a sequentially laminated body of an inorganic protective film PAS1 formed of, for example, a silicon nitride film and an organic protective film PAS2 formed of, for example, a resin film is further formed so as to cover the drain signal line DL and the thin film transistor TFT. The protective film PAS avoids the direct contact between the thin film transistor TFT and liquid crystals and prevents the deterioration of characteristics of the thin film transistor TFT.

In each of the regions of the first pixel PIX1, the second pixel PIX2, the third pixel PIX3, and the fourth pixel PIX4 on the upper surface of the protective film PAS, the pixel electrode PX formed of a translucent conductive film such as of ITO (Indium Tin Oxide) is formed. Each of the pixel electrodes PX is electrically connected to the source electrode ST (specifically the extended portion of the source electrode ST) of the thin film transistor TFT in each of the pixels through a through hole TH that is previously formed in the protective film PAS. The pixel electrode PX is formed so as to overlap with the extended portion of the source electrode ST in a large area near the through hole TH. With this configuration, a second capacitive element CP2 (refer to FIG. 2) with the protective film PAS being as a dielectric film is formed. The second capacitive element CP2 constitutes the capacitive element CP shown in FIG. 4 together with the aforementioned first capacitive element CP1, whereby a large capacitance value is obtained.

As shown in FIG. 1, the pixel electrode PX is formed such that one of a pair of sides of the pixel electrode in a direction crossing the running direction of the gate signal line GL has a portion overlapping with the drain signal line DL or the storage line STL, and the other side has a portion overlapping with the storage line STL or the drain signal line DL. For example, when the third pixel PIX3 is shown as an example, a side (indicated by reference sign SL in the drawing) of the pixel electrode PX on the left in the drawing has a portion overlapping with the drain signal line DL2 that is disposed adjacent to the side, and a side (indicated by reference sign SR in the drawing) on the right in the drawing has a portion overlapping with the storage line STL4 that is disposed adjacent to the side. The pixel electrode PX overlaps with the drain signal line DL along the running direction of the drain signal line DL in a certain length. The pixel electrode PX overlaps with the storage line STL along the running direction of the storage line STL in a certain length. The pixel electrode PX is disposed so as to interpose the organic protective film PAS2 between the pixel electrode PX, and the drain signal line DL and the storage line STL. This makes it possible to dispose each of the pixel electrodes PX above the drain signal line DL or the storage line STL and close to the pixel electrode PX in the neighboring pixel. With this configuration, the pixel electrode PX can assure a maximum area in each of the pixel regions. The drain signal line DL or the storage line STL can block light between the pixel regions adjacent to each other in the running direction of the gate signal line GL. Although an alignment film is formed so as to cover the pixel electrodes PX on the surface of the first substrate SUB1 where the pixel electrodes PX are formed, the alignment film is omitted in FIGS. 2 and 3.

As shown in FIGS. 2 and 3, on the face of the second substrate SUB2, which is disposed to face the first substrate SUB1 via the liquid crystal LC, on the liquid crystal LC side, a black matrix (light shielding film) BM, a color filter CF, a planarization film OC, a counter electrode CT formed of a translucent conductive film such as of ITO are formed. On the surface of the second substrate SUB2 formed with the counter electrode CT, an alignment film is formed so as to cover the counter electrode CT. However, the alignment film is omitted in FIGS. 2 and 3. As shown in FIG. 3, the black matrix (light shielding film) BM is also formed in a region between other pixels adjacent to each other in the running direction of the gate signal line GL, for example. In this case, in the region, also the drain signal line DL and the storage line STL formed on the first substrate SUB1 side have a function of a light shielding film as described above. Each of the sides of the pixel electrode PX crossing the running direction of the gate signal line GL is formed so as to overlap with the drain signal line DL or the storage line STL. In view of this, the black matrix (light shielding film) BM formed on the second substrate SUB2 side can be formed to cooperate with the drain signal line DL or the storage line STL, so that a width Wb of the black matrix (light shielding film) BM can be made smaller than widths Wd and Ws of the drain signal line DL and the storage line STL, for example. Therefore, the aperture ratio in each pixel can be remarkably improved.

[Second Embodiment]

Figure 5:
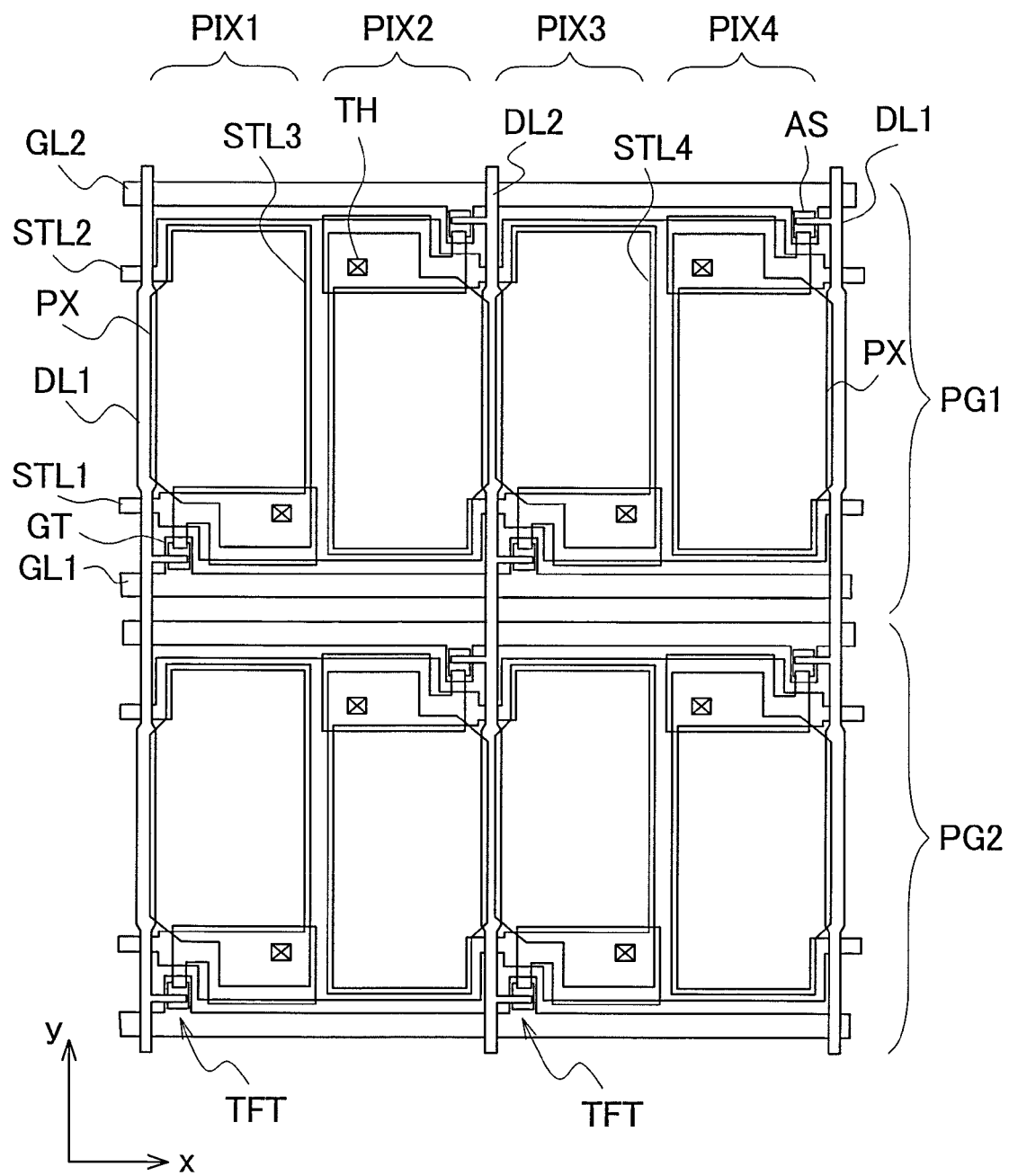
FIG. 5 is a plan view showing a second embodiment of pixels of a liquid crystal display device of the invention.

FIG. 5 shows a second embodiment of the configuration of pixels in the image display region of a liquid crystal display device of the invention and is a plan view corresponding to FIG. 1.

In FIG. 5, the configuration different from FIG. 1 is the arrangement state of the first pixel group PG1 and the second pixel group PG2. The second pixel group PG2 is disposed so as not to shift from the first pixel group PG1. As a result, each of the drain signal lines DL is formed linearly along the y-direction in the drawing without having the bent portion in the region between the first pixel group PG1 and the second pixel group PG2.

The configuration of the first pixel PIX1, the second pixel PIX2, the third pixel PIX3, and the fourth pixel PIX4 in the first pixel group PG1 and the configuration of the first pixel PIX1, the second pixel PIX2, the third pixel PIX3, and the fourth pixel PIX4 in the second pixel group PG2 are the same as those shown in FIG. 1.

[Third Embodiment]

Figure 6:
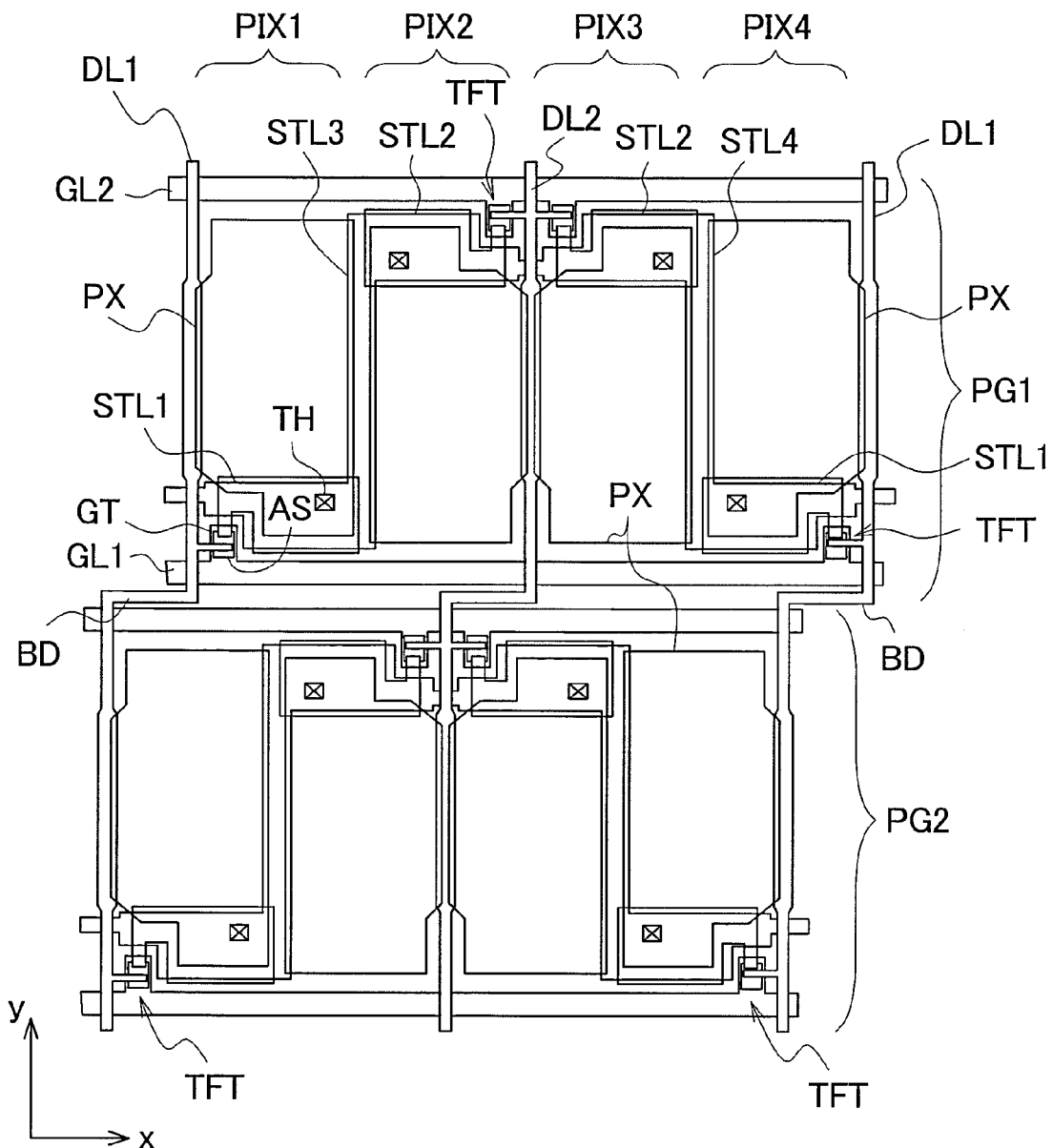
FIG. 6 is a plan view showing a third embodiment of pixels of a liquid crystal display device of the invention.

FIG. 6 shows a third embodiment of the configuration of pixels in the image display region of a liquid crystal display device of the invention and is a plan view corresponding to FIG. 1.

In FIG. 6, similarly to the case of FIG. 1, the first pixel PIX1, the second pixel PIX2, the third pixel PIX3, and the fourth pixel PIX4 are repeatedly disposed in this order in one direction in each of the pixels in the first pixel group PG1. The first pixel group PG1 has the pair of first gate signal line GL1 and second gate signal line GL2 that run in the x-direction in the drawing with the first pixel group PG1 therebetween.

Each of the thin film transistors TFT of the first pixel PIX1 and the fourth pixel PIX4 is configured to be turned on by a video signal from the first gate signal line GL1. Each of the thin film transistors TFT of the second pixel PIX2 and the third pixel PIX3 is configured to be turned on by a video signal from the second gate signal line GL2. In view of this, each of the thin film transistors TFT of the first pixel PIX1 and the fourth pixel PIX4 is disposed adjacent to the first gate signal line GL1, and each of the thin film transistors TFT of the second pixel PIX2 and the third pixel PIX3 is disposed adjacent to the second gate signal line GL2.

A video signal is supplied from the first drain signal line DL1 that runs between the fourth pixel PIX4 and the first pixel PIX1 to each of the pixel electrodes PX of the first pixel PIX1 and the fourth pixel PIX4. A video signal is supplied from the second drain signal line DL2 that runs between the second pixel PIX2 and the third pixel PIX3 to each of the pixel electrodes PX of the second pixel PIX2 and the third pixel PIX3.

The storage line STL includes the first storage line STL1, the second storage line STL2, the third storage line STL3, and the fourth storage line STL4. The first storage line STL1 is adjacent to the first gate signal line GL1 and formed along the first gate signal line GL1 in the first pixel PIX1 and the fourth pixel PIX4. The second storage line STL2 is adjacent to the second gate signal line GL2 and formed along the second gate signal line GL2 in the second pixel PIX2 and the third pixel PIX3. The third storage line STL3 runs between the first pixel PIX1 and the second pixel PIX2 and is electrically connected to the first storage line STL1 and the second storage line STL2. The fourth storage line STL4 runs between the third pixel PIX3 and the fourth pixel PIX4 and is electrically connected to the first storage line STL1 and the second storage line STL2. In this case, the storage line STL is formed wide at a portion adjacent to the first gate signal line GL1 or the second gate signal line GL2 in each of the pixels PIX to constitute one of electrodes of the capacitive element CP in each of the pixels.

The thus configured storage line STL can be formed so as to run between the first gate signal line GL1 and the second gate signal line GL2 in a meandering manner. That is, in each of the pixels, it is possible to dispose the storage line STL only on one gate signal line GL side of the first gate signal line GL1 and the second gate signal line GL2 without providing the storage line on the other gate signal line GL side. This makes it possible in each of the pixels PIX to improve the aperture ratio corresponding to the amount of the storage line STL which is not formed. In the arrangement of the pixels PIX shown in the first embodiment (FIG. 1), it is found that omitting a part of the storage line STL is difficult in each of the pixels under the condition of the same configuration.

The pixels PIX shown in FIG. 6 are not vertically and horizontally symmetrical, but has the same configuration as that of the pixels shown in FIG. 1. When a pair of sides of each of the pixel electrodes PX in a direction crossing the running direction of the gate signal line GL are respectively defined as a first side and a second side, the first side has a portion overlapping with the drain signal line DL disposed adjacent to the first side, and the second side has a portion overlapping with the storage line STL disposed adjacent to the second side, in a plan view.

[Fourth Embodiment]

Figure 7:
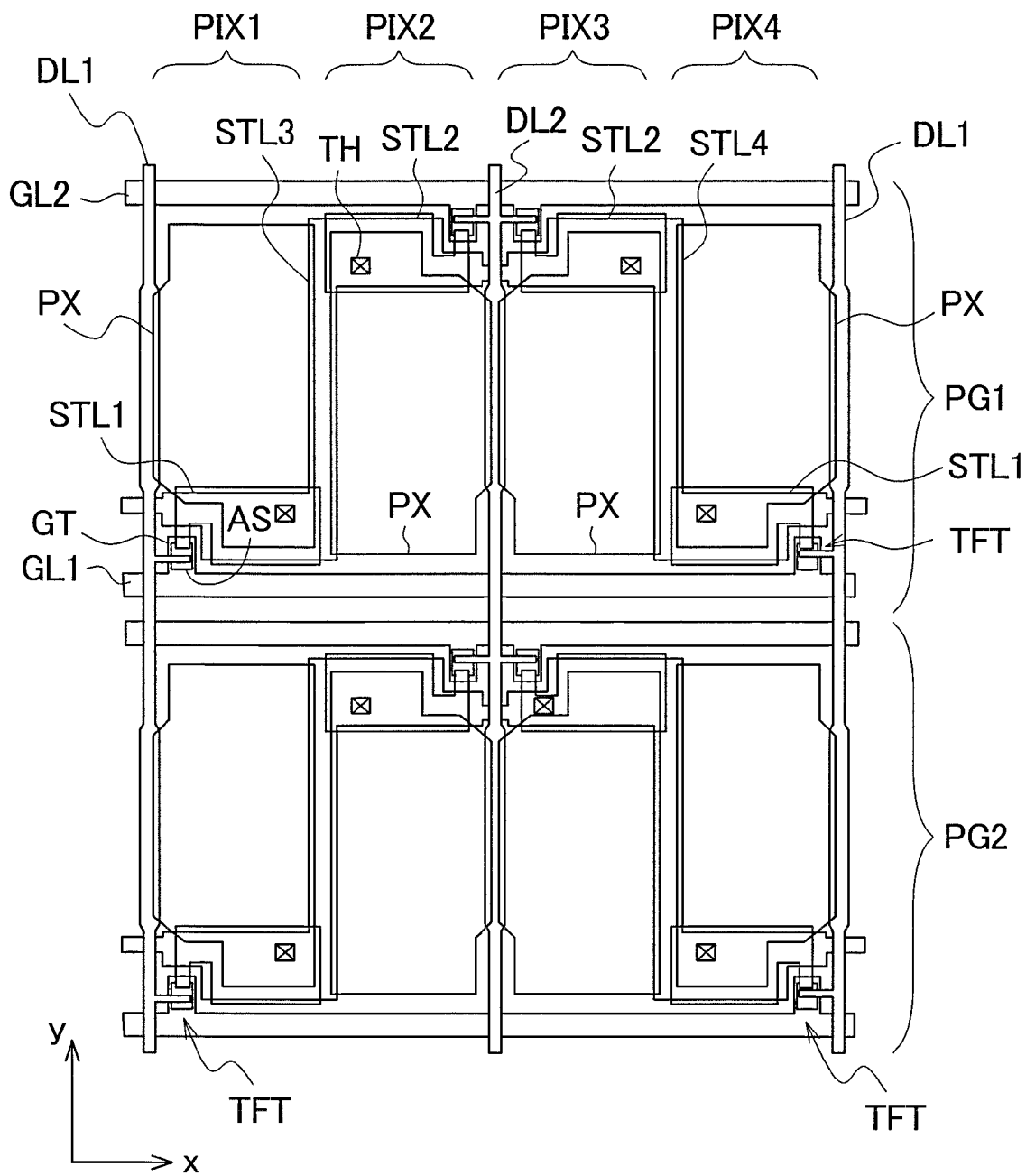
FIG. 7 is a plan view showing a fourth embodiment of pixels of a liquid crystal display device of the invention.

FIG. 7 shows a fourth embodiment of the configuration of pixels in the image display region of a liquid crystal display device of the invention and is a plan view corresponding to FIG. 6.

In FIG. 7, the configuration different from FIG. 6 is the arrangement state of the first pixel group PG1 and the second pixel group PG2. The second pixel group PG2 is disposed so as not to shift from the first pixel group PG1. As a result, each of the drain signal lines DL is linearly formed along the y-direction in the drawing and formed without having a bent portion in a region between the first pixel group PG1 and the second pixel group PG2.

[Fifth Embodiment]

Figure 8:
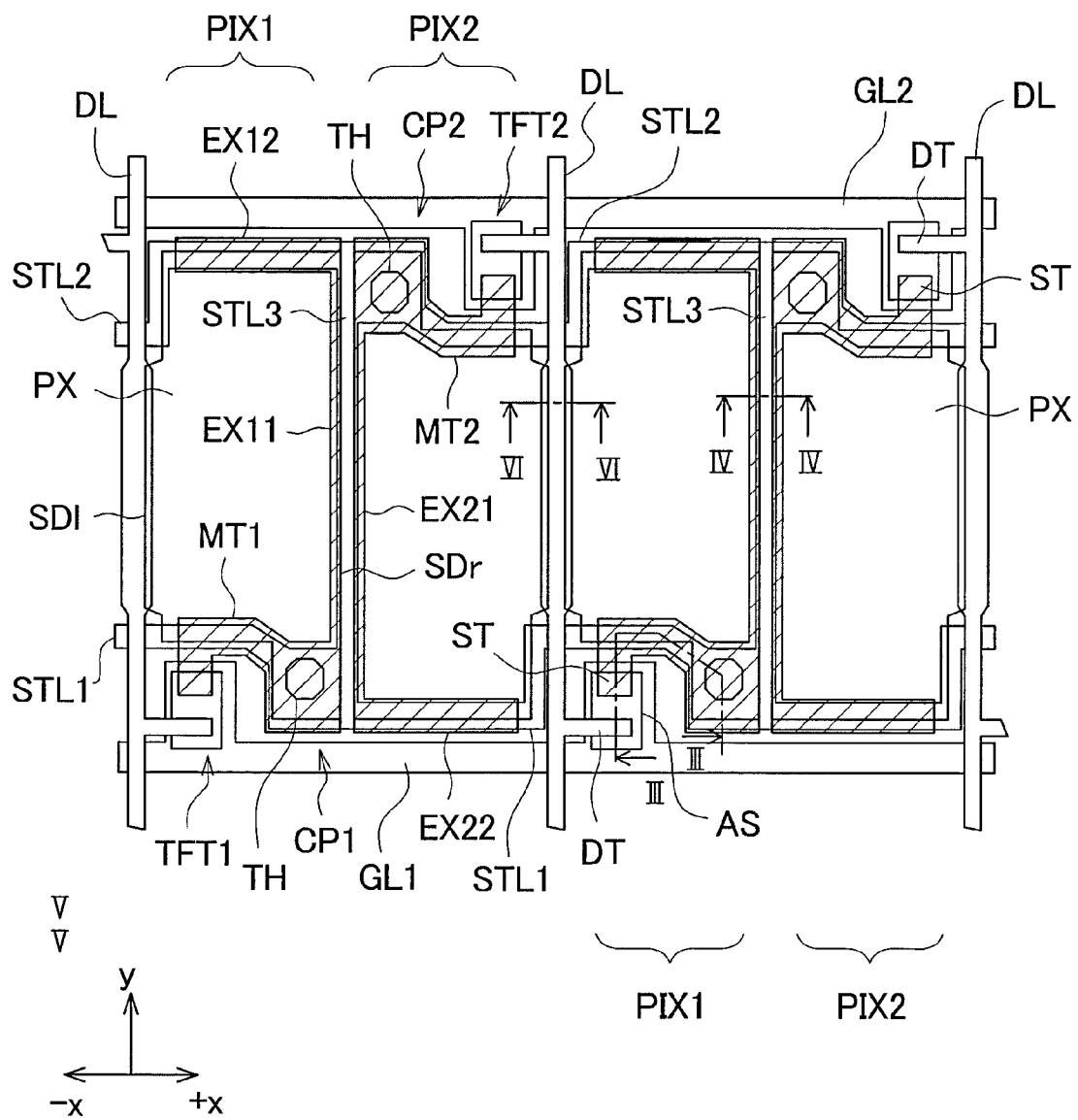
FIG. 8 is a plan view of pixels showing a fifth embodiment of a liquid crystal display device of the invention.
Figure 10:
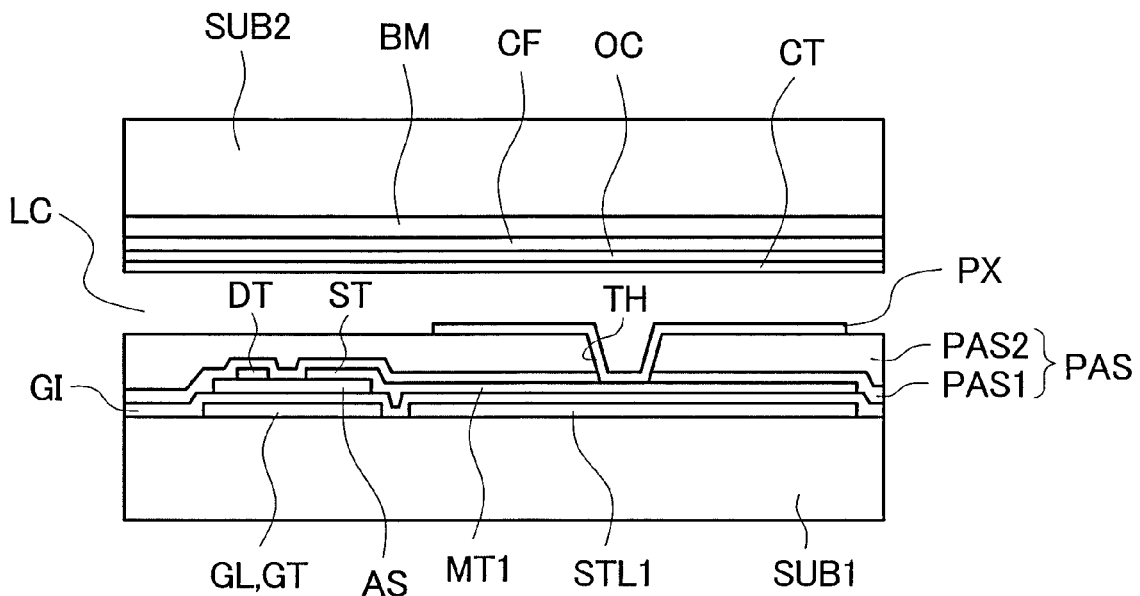
FIG. 10 is a cross-sectional view taken along line III-II of FIG. 8.
Figure 11:
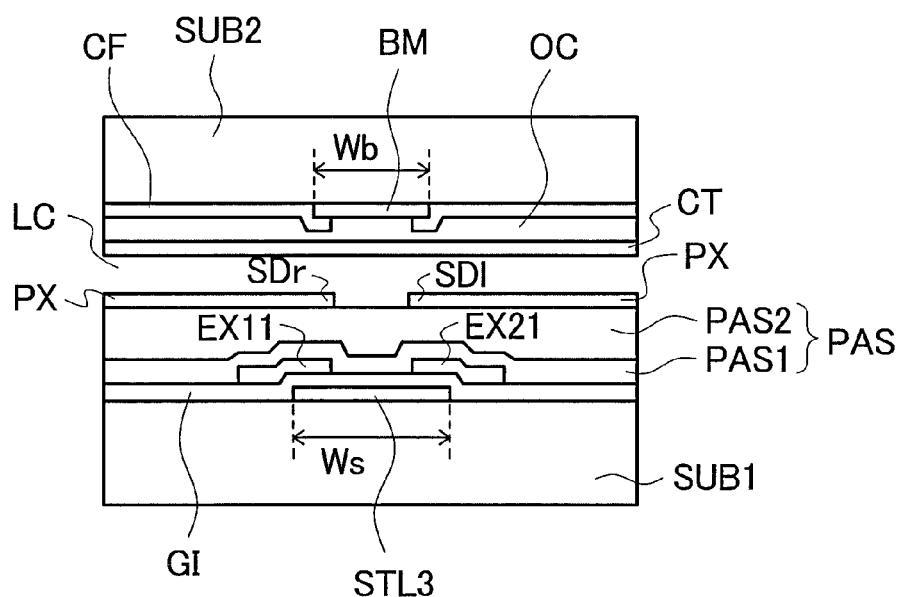
FIG. 11 is a cross-sectional view taken along line IV-IV of FIG. 8.

FIG. 8 is a plan view showing a fifth embodiment of pixels of a liquid crystal display device of the invention. FIG. 8 shows pixels formed on the face of one substrate (first substrate SUB1) of the pair of substrates, which are disposed so as to face each other with liquid crystal interposed therebetween, on the liquid crystal side. FIG. 10 shows a cross-sectional view taken along line III-III of FIG. 8 together with the other substrate (second substrate SUB2). FIG. 11 shows a cross-sectional view taken along line IV-IV of FIG. 8 together with the other substrate SUB2.

FIG. 8 shows a pixel group (first pixel group PG1) disposed in a row direction (the x-direction in the drawing) among a plurality of pixels disposed in a matrix in an image display region and shows, for example, four pixels adjacent to each other in the first pixel group PG1. For the convenience of description, the pixels are referred to as the first pixel PIX1 and the second pixel PIX2 and are described distinctively from one another. This is because although the first pixel PIX1 and the second pixel PIX2 have the same configuration, they are arranged in a laterally and vertically symmetrical manner. The four pixels shown in FIG. 8, for example, are disposed in the order of the first pixel PIX1, the second pixel PIX2, the first pixel PIX1, and the second pixel PIX2 from the left to the right in the drawing and disposed repeatedly in this order thereafter.

Figure 9:
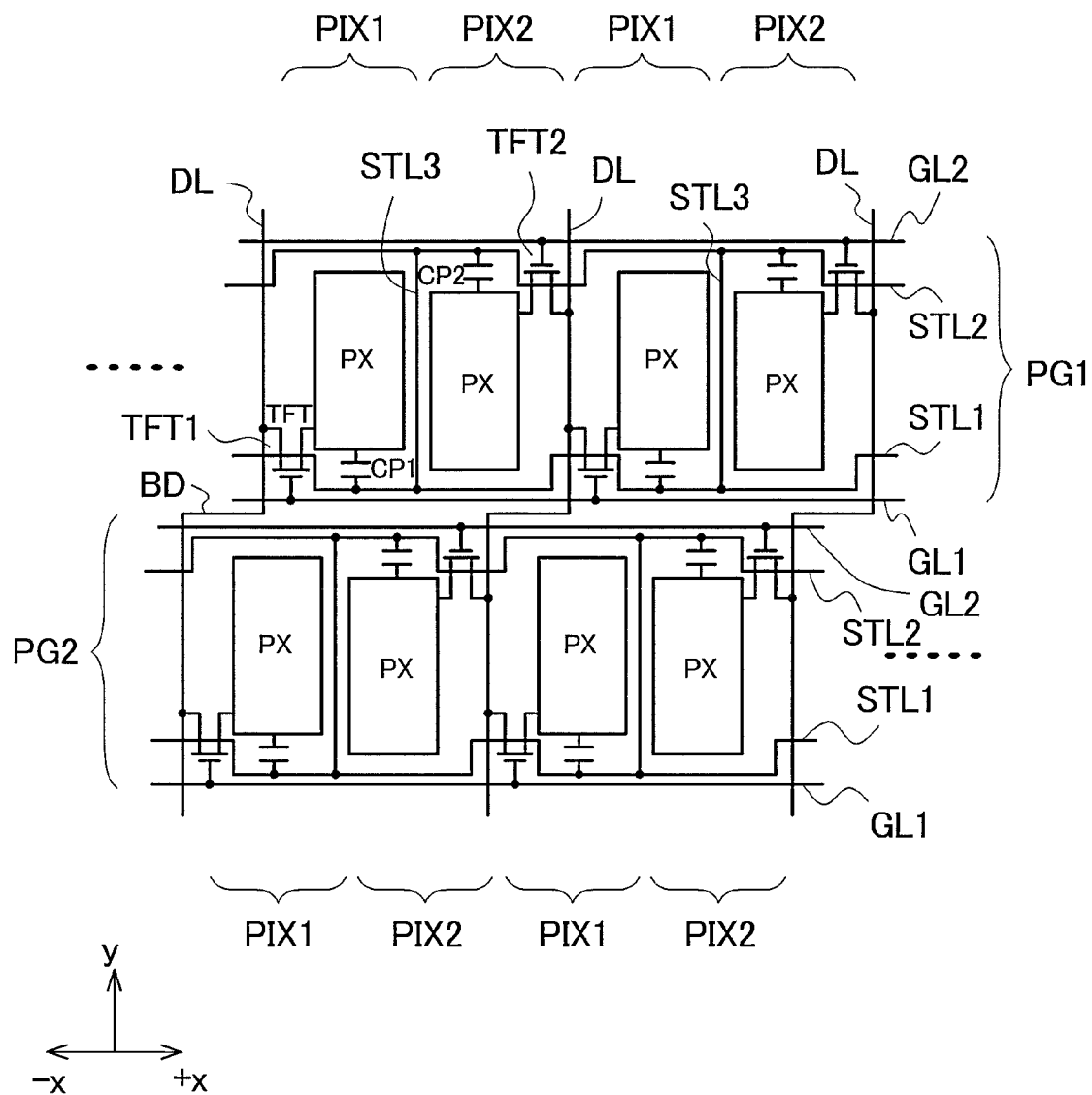
FIG. 9 is an equivalent circuit diagram of the pixels showing the fifth embodiment of the liquid crystal display device of the invention.

Before describing FIG. 8, the outline will be described by using an equivalent circuit of FIG. 9 that corresponds to FIG. 8. In FIG. 9, however, in addition to the pixel group (first pixel group PG1) formed of the four pixels disposed in the row direction (x-direction in the drawing), a pixel group (second pixel group PG2) formed of four pixels disposed in the column direction (the y-direction in the drawing) are also illustrated. In FIG. 9, the first pixel group PG1 has the first gate signal line GL (indicated by reference sign GL1 in the drawing) and the second gate signal line GL (indicated by reference sign GL2 in the drawing) that run in the x-direction in the drawing with the first pixel group PG1 therebetween. A thin film transistor TFT (indicated by reference sign TFT1 in the drawing) of the first pixel PIX1 is controlled by a scanning signal from the first gate signal line GL1. A thin film transistor TFT (indicated by reference sign TFT2 in the drawing) of the second pixel PIX2 is controlled by a scanning signal from the second gate signal line GL2. In view of this, the thin film transistor TFT1 of the first pixel PIX1 is disposed adjacent to the first gate signal line GL1 side, and the thin film transistor TFT2 of the second pixel PIX2 is disposed adjacent to the second gate signal line GL2 side. The drain signal line DL runs between the first pixel PIX1 and the second pixel PIX2 adjacent to the first pixel PIX1 in the (−)x-direction in the drawing. A video signal from the drain signal line DL is supplied to the pixel electrode PX through the thin film transistor TFT1 in the first pixel PIX1 and supplied to the pixel electrode PX through the thin film transistor TFT2 in the second pixel PIX2.

In the first pixel group PG1, the first storage line STL (indicated by reference sign STL1 in the drawing) that is adjacent to the first gate signal line GL1 and is extended along the first gate signal line GL1 and the second storage line STL (indicated by reference sign STL2 in the drawing) that is adjacent to the second gate signal line GL2 and is extended along the second gate signal line GL2 are disposed. The first storage line STL1 forms the capacitive element CP (indicated by reference sign CP1 in the drawing) between the first storage line and the pixel electrode PX in the first pixel PIX1 and forms the capacitive element CP (indicated by reference sign CP2 in the drawing) between the first storage line and the pixel electrode PX in the second pixel PIX2. Conventionally, therefore, the capacitive element CP1 of the first pixel PIX1 is formed in the forming region of the first storage line STL1 in the first pixel PIX1, and the capacitive element CP2 of the second pixel PIX2 is formed in the forming region of the second storage line STL2 in the second pixel PIX2. In the embodiment, however, the capacitive elements CP1 and CP2 are formed in regions other than the above regions although not shown in FIG. 9. This configuration will be described in detail later. In the embodiment, moreover, the third storage line STL (indicated by reference sign STL3 in the drawing) that runs between the first pixel PIX1 and the second pixel PIX2 adjacent to the first pixel PIX1 in the (+)x-direction in the drawing and is electrically connected to the first storage line STL1 and the second storage line STL2 is newly disposed. An advantage of the third storage line STL3 will be described later.

To the thus configured first pixel group PG1, the second pixel group PG2 is disposed in the column direction (the y-direction in the drawing). The first pixel PIX1 and the second pixel PIX2 in the second pixel group PG2 are respectively configured similarly to the first pixel PIX1 and the second pixel PIX2 in the first pixel group PG1. In the embodiment, the second pixel group PG2 is disposed so as to shift from the first pixel group PG1 in the (−)x-direction in the drawing by a half pitch of the pixel. Therefore, each of the drain signal lines DL in the first pixel group PG1 is connected to the corresponding drain signal line DL in the second pixel group PG2 with the bent portion BD in a region between the first pixel group PG1 and the second pixel group PG2. Although not shown in the drawing, a pixel group disposed adjacent to the first pixel group PG1 at the upper side of the drawing is also disposed so as to shift in the (−)x-direction in the drawing by a half pitch of the pixel. However, the pixel groups are not necessarily arranged to shift from each other. Accordingly, the drain signal line DL may be linearly formed without having the bent portion BD.

Returning to FIG. 8, on the face (surface) of the first substrate SUB1 (refer to FIGS. 10 and 11) on the liquid crystal side, the first gate signal line GL1, the second gate signal line GL2, the first storage line STL1, the second storage line STL2, and the third storage line STL3 are formed. The first gate signal line GL1, the second gate signal line GL2, the first storage line STL1, the second storage line STL2, and the third storage line STL3 are formed of a lightproof material such as metal, for example, and formed simultaneously, for example.

The first gate signal line GL1 has a protruding portion formed so as to protrude toward the center side of the pixel in a region of the first pixel PIX1. The protruding portion constitutes the gate electrode GT of the thin film transistor TFT1 in the first pixel PIX1. Similarly, the second gate signal line GL2 has a protruding portion formed so as to protrude toward the center side of the pixel in a region of the second pixel PIX2. The protruding portion constitutes the gate electrode GT of the thin film transistor TFT2 in the second pixel PIX2.

The first storage line STL1 has a portion that is formed wide in the region of the first pixel PIX1 to constitute one of electrodes of the capacitive element CP1 in the first pixel PIX1. Similarly, the second storage line STL2 has a portion that is formed wide in the region of the second pixel PIX2 to constitute one of electrodes of the capacitive element CP2 in the second pixel PIX2.

In this case, the third storage line STL3 is formed between the first pixel PIX1 and the second pixel PIX2 adjacent to the first pixel PIX1 in the (+)x-direction in the drawing. The third storage line STL3 is formed in a portion where the drain signal line DL described later does not run, and electrically connected to the first storage line STL1 and the second storage line STL2. With this configuration, in the first pixel PIX1, the drain signal line DL is positioned on the left of the first pixel in the drawing, and the third storage line STL3 is positioned on the right thereof in the drawing. In the second pixel PIX2, the third storage line STL3 is positioned on the left of the second pixel in the drawing, and the drain signal line DL is positioned on the right thereof in the drawing.

On the surface of the first substrate SUB1, the insulating film GI (refer to FIGS. 10 and 11) formed of, for example, a silicon oxide film is formed so as to cover the first gate signal line GL1, the second gate signal line GL2, the first storage line STL1, the second storage line STL2, and the third storage line STL3. The insulating film GI functions as a gate insulating film in the forming region of the thin film transistor TFT described later.

The island-like semiconductor layer AS formed of amorphous silicon, for example, is formed on the upper surface of the insulating film GI at a portion where the semiconductor layer overlaps with the gate electrode GT. The semiconductor layer AS serves as a semiconductor layer of a MIS (Metal Insulator Semiconductor) type thin film transistor TFT, and the drain electrode DT and the source electrode ST that are disposed to face each other are formed on the upper surface of the semiconductor layer. In the first pixel PIX1, a part of the drain signal line DL that runs between the first pixel PIX1 and the second pixel PIX2 adjacent to the first pixel PIX1 in the (−)x-direction in the drawing is extended to constitute the drain electrode DT of the thin film transistor TFT1. In this case, also in the second pixel PIX2, a part of the drain signal line DL is extended to constitute the drain electrode DT of the thin film transistor TFT2. In the second pixel PIX2, a part of the drain signal line DL that runs between the second pixel PIX2 and the first pixel PIX1 adjacent to the second pixel PIX2 in the (+)x-direction in the drawing is extended to constitute the drain electrode DT of the thin film transistor TFT2. In this case, also in the first pixel PIX1, a part of the drain signal line DL is extended to constitute the drain electrode DT of the thin film transistor TFT1.

Each of the source electrodes ST of the thin film transistor TFT1 of the first pixel PIX1 and the thin film transistor TFT2 of the second pixel PIX2 is formed simultaneously when the drain signal line DL is formed, for example. In the first pixel PIX1, the source electrode ST has an extended portion MT (indicated by reference sign MT1 in the drawing) that is extended to the pixel region side. The extended portion MT1 is formed so as to overlap with the first storage line STL1 formed adjacent to the thin film transistor TFT1. The overlapped portion of the extended portion MT1 of the source electrode ST and the first storage line STL1 constitutes a capacitance. Similarly in the second pixel PIX2, the source electrode ST has an extended portion MT (indicated by reference sign MT2 in the drawing) that is extended to the pixel region side. The extended portion MT2 is formed so as to overlap with the second storage line STL2 formed adjacent to the thin film transistor TFT2. The overlapped portion of the extended portion MT2 of the source electrode ST and the second storage line STL2 constitutes a capacitance. For the convenience of later description, in the specification, each of the extended portions MT of the source electrode ST is named "intermediate electrode MT". The source electrode ST is electrically connected to the pixel electrode PX described later via the intermediate electrode MT.

The intermediate electrode MT is formed to include not only the portion overlapping with the storage line STL but also an extended portion extending to the hatched region in the drawing as shown in FIG. 8. That is, in the case of the first pixel PIX1, the intermediate electrode MT1 that is formed so as to overlap with the first storage line STL1 first includes a first extended portion EX1 (indicated by reference sign EX11 in the drawing) extending along the running direction of the third storage line STL3 on the near side of the third storage line STL3. The first extended portion EX11 is extended with a relatively narrow width. A side of the first extended portion EX11 on the third storage line STL3 side partially overlaps with the third storage line STL3, so that a gap is not formed between the first extended portion EX11 and the third storage line STL3. The first extended portion EX11 has a narrow width for preventing the first extended portion EX11 having a light shielding function from being formed in a wide area in the region of pixel. The first extended portion EX11 includes a second extended portion EX12 that bends in a direction crossing the running direction of the third storage line STL3 at an extended end in the running direction of the third storage line STL3. The second extended portion EX2 (indicated by reference sign EX12 in the drawing) is formed so as to overlap with the second storage line STL2 formed in the region of the first pixel PIX1. Similarly in the case of the second pixel PIX2, the intermediate electrode MT2 that is formed so as to overlap with the second storage line STL2 first includes a first extended portion EX2 (indicated by reference sign EX21 in the drawing) extending along the running direction of the third storage line STL3 on the near side of the third storage line STL3. The first extended portion EX21 is extended with a relatively narrow width. A side of the first extended portion EX21 on the third storage line STL3 side partially overlaps with the third storage line STL3, so that a gap is not formed between the first extended portion EX21 and the third storage line STL3. The first extended portion EX21 includes a second extended portion EX2 (indicated by reference sign EX22 in the drawing) that bends in the direction crossing the running direction of the third storage line STL3 at an extended end in the running direction of the third storage line STL3. The second extended portion EX22 is formed so as to overlap with the first storage line STL1 formed in the region of the second pixel PIX2.

With such a configuration, in the first pixel PIX1 for example, a new capacitance can be formed between the first extended portion EX11 and the third storage line STL3 and between the second extended portion EX12 and the second storage line STL2 by disposing the first extended portion EX11 and the second extended portion EX12 for the intermediate electrode MT1. In this case, it is sufficient to form the first extended portion EX11 and the second extended portion EX12 so as to overlap with the storage line STL, and they can be formed while remarkably preventing a reduction in the aperture ratio of the pixel. The capacitance formed between the first storage line STL1 and the intermediate electrode in the first pixel PIX1 can be configured small in proportion to an increased amount of the capacitance due to the formation of the first extended portion EX11 and the second extended portion EX12 as described above, so that the area of the capacitive element occupying this portion can be made small. Accordingly, the aperture ratio of the first pixel PIX1 can be improved. The same applies to the second pixel PIX2.

The capacitive element CP in each of the pixels is formed between the storage line STL and the intermediate electrode MT as well as formed in the overlapped portion of the intermediate electrode MT and the pixel electrode PX described later.

On the surface of the first substrate SUB1, the protective film PAS (refer to FIGS. 10 and 11) that is formed of a sequentially laminated body of an inorganic protective film PAS1 formed of, for example, a silicon nitride film and an organic protective film PAS2 formed of, for example, a resin film is further formed so as to cover the drain signal line DL and the thin film transistor TFT. The protective film PAS avoids the direct contact between the thin film transistor TFT and liquid crystal and prevents the deterioration of characteristics of the thin film transistor TFT.

In each of the regions of the first pixel PIX1 and the second pixel PIX2 on the upper surface of the protective film PAS, the pixel electrode PX formed of a translucent conductive film such as of ITO (Indium Tin Oxide) is formed. Each of the pixel electrodes PX is electrically connected to the intermediate electrode MT through the through hole TH that is previously formed through the protective film PAS in each of the pixels. The pixel electrode PX is formed so as to overlap with the intermediate electrode MT in a relatively wide area near the through hole TH and constitutes a capacitance with the protective film PAS being as a dielectric film. Also the capacitance constitutes the capacitive element CP.

As shown in FIG. 8, the pixel electrode PX is formed such that one of a pair of sides of the pixel electrode crossing the running direction of the gate signal line GL has a portion overlapping with the drain signal line DL (or the storage line STL), and the other side has a portion overlapping with the storage line STL (or the drain signal line DL). For example, when the first pixel PIX1 is shown as an example, a side SD (indicated by reference sign SDl in the drawing) of the pixel electrode PX on the left in the drawing has a portion overlapping with the drain signal line DL disposed adjacent to the side SDl, and a side SD (indicated by reference sign SDr in the drawing) thereof on the right in the drawing overlaps with the third storage line STL3 disposed adjacent to the side. The pixel electrode PX overlaps with the drain signal line DL along the running direction of the drain signal line DL in a certain length. The pixel electrode PX overlaps with the third storage line STL3 along the third storage line STL3 in a certain length. Since the pixel electrode PX is disposed so as to interpose the organic protective film PAS2 between the pixel electrode PX, and the drain signal line DL and the third storage line STL3, the capacitance between the drain signal line DL and the third storage line STL3 can be configured small. This makes it possible to dispose the pixel electrodes PX in the neighboring pixels close to each other above the drain signal line DL or the third storage line STL3. Therefore, the pixel electrode PX can assure a maximum area in each of the pixel regions. The drain signal line DL and the third storage line STL3 can block light in the region between the pixels adjacent to each other in the running direction of the gate signal line GL. Although an alignment film is formed so as to cover the pixel electrodes PX on the surface of the first substrate SUB1 where the pixel electrodes PX are formed, the alignment film is omitted in FIGS. 10 and 11.

As shown in FIGS. 10 and 11, on the face of the second substrate SUB2, which is disposed to face the first substrate SUB1 via the liquid crystal LC, on the liquid crystal side, the black matrix (light shielding film) BM, the color filter CF, the planarization film OC, the counter electrode CT formed of, for example, an ITO film are formed. On the surface of the second substrate SUB2 formed with the counter electrode CT, an alignment film is formed so as to cover the counter electrode CT. However, the alignment film is omitted in FIGS. 10 and 11. As shown in FIG. 11, the black matrix (light shielding film) BM is also formed in a region between the pixels adjacent to each other in the running direction of the gate signal line GL, for example. In this case, in the region, also the drain signal line DL and the storage line STL formed on the first substrate SUB1 side have a function of a light shielding film as described above. Each of the sides of the pixel electrode PX crossing the running direction of the gate signal line GL is formed so as to overlap with the drain signal line DL or the storage line STL. In view of this, the black matrix (light shielding film) BM formed on the second substrate SUB2 side can be formed to cooperate with the drain signal line DL or the storage line STL. Accordingly, the width Wb of the black matrix (light shielding film) BM can be made smaller than the width Ws of the third storage line STL, for example.

Similarly, the width of the black matrix (light shielding film) above the drain signal line DL can be made smaller than that of the drain signal line DL. Therefore, the aperture ratio in each pixel can be remarkably improved.

[Sixth Embodiment]

Figure 12:
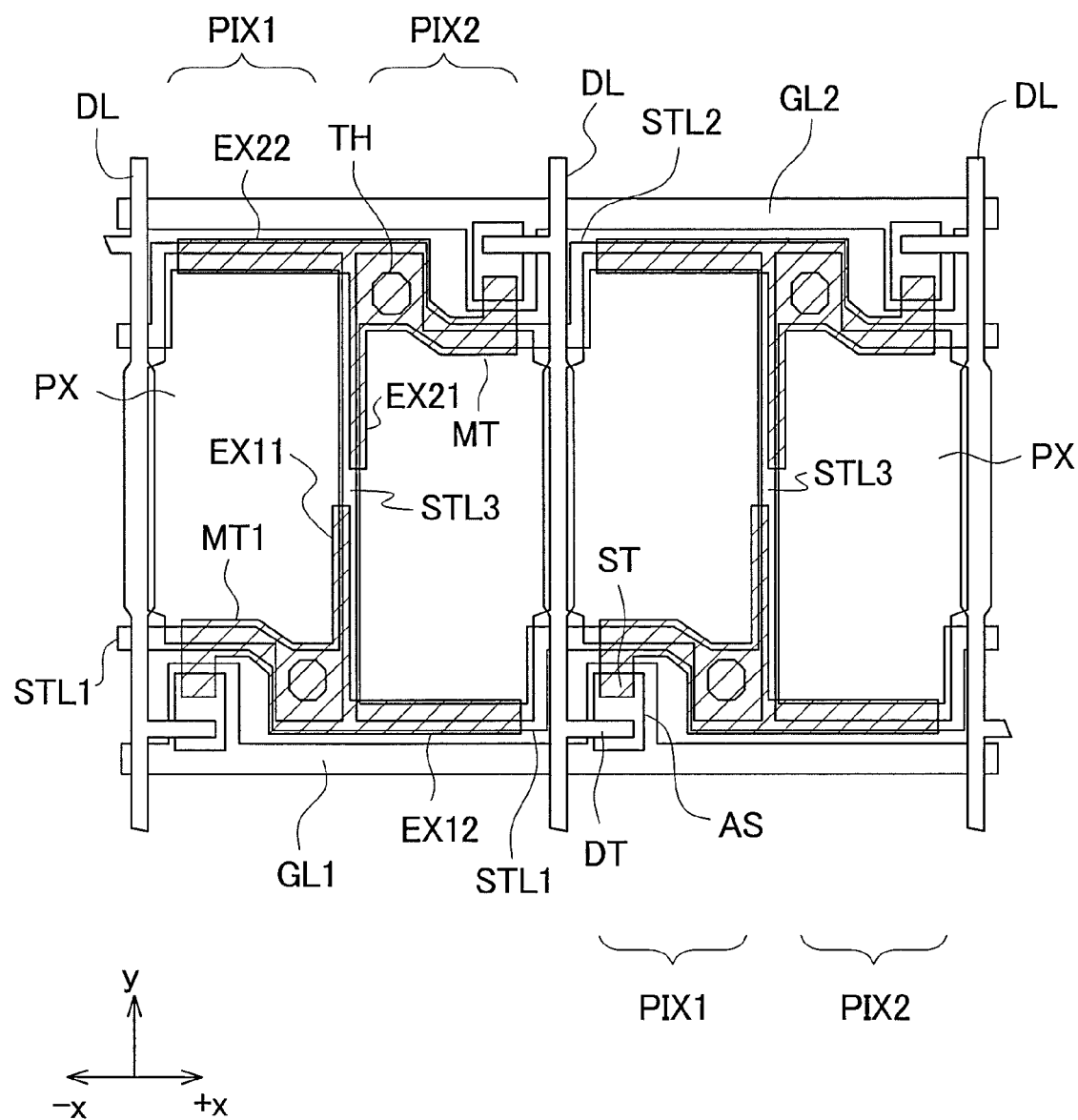
FIG. 12 is a plan view of pixels showing a sixth embodiment of a liquid crystal display device of the invention.

FIG. 12 shows a sixth embodiment of the configuration of pixels in the image display region of a liquid crystal display device of the invention and is a plan view corresponding to FIG. 8.

In FIG. 12, the configuration different from FIG. 8 is the intermediate electrode MT. The other configurations are the same as those in FIG. 8. That is, in the first pixel PIX1, the intermediate electrode MT1 formed so as to overlap with the first storage line STL1 first includes the first extended portion EX11 extending along the running direction of the third storage line STL3 on the near side of the third storage line STL3. The first extended portion EX11 has a terminal end at the halfway portion of the first pixel PIX1, for example, in the y-direction in the drawing. The first extended portion EX11 is extended with a relatively narrow width. A side of the first extended portion EX11 on the third storage line STL3 side partially overlaps with the third storage line STL3, so that a gap is not formed between the first extended portion EX11 and the third storage line STL3 in the same manner as in FIG. 8. The intermediate electrode MT1 is formed to include the second extended portion EX12 that is formed so as to overlap with the first storage line STL1 extending in the second pixel PIX2 adjacent in the (+)x-direction in the drawing. Similarly, in the second pixel PIX2, the intermediate electrode MT2 formed so as to overlap with the second storage line STL2 first includes the first extended portion EX21 extending along the running direction of the third storage line STL3 on the near side of the third storage line STL3. The first extended portion EX21 has a terminal end at the halfway portion of the second pixel PIX2, for example, in the (−)y-direction in the drawing. The first extended portion EX21 is extended with a relatively narrow width. A side of the first extended portion EX21 on the third storage line STL3 side partially overlaps with the third storage line STL3, so that a gap is not formed between the first extended portion EX21 and the third storage line STL3. The intermediate electrode MT2 is formed to include the second extended portion EX22 formed so as to overlap with the second storage line STL2 extending in the neighboring first pixel PIX1 in the (−)x-direction in the drawing.

Even with such a configuration, in the first pixel PIX1 for example, a new capacitance can be formed between the first extended portion EX11 and the third storage line STL3 and between the second extended portion EX12 and the first storage line STL1 formed in the neighboring second pixel PIX2 by disposing the first extended portion EX11 and the second extended portion EX12 for the intermediate electrode MT1. In this case, it is sufficient to form the first extended portion EX11 and the second extended portion EX12 so as to overlap with the storage line STL, and they can be formed while remarkably preventing a reduction in the aperture ratio of the pixel. The capacitance formed between the intermediate electrode and the first storage line STL1 in the first pixel PIX1 can be configured small in proportion to an increased amount of the capacitance due to the formation of the first extended portion EX11 and the second extended portion EX12 as described above, so that the area of the capacitive element occupying this portion can be made small. Accordingly, the aperture ratio of the first pixel PIX1 can be improved.

In FIG. 12, the first extended portion EX11 of the intermediate electrode MT that is formed so as to overlap with the third storage line STL3 is formed up to the halfway portion of the pixel. When the first extended portion EX11 is configured as descried above, the first extended portion EX11 of the intermediate electrode MT1 in the first pixel PIX1 and the first extended portion EX21 of the intermediate electrode MT2 in the second pixel PIX2 are not arranged in a back-to-back manner (parallel arrangement) above the third storage line STL3. Therefore, the first extended portion EX11 and the first extended portion EX21 can overlap with the third storage line STL3 in a large area (the first extended portion EX1 can has a large width). However, this is not restrictive. The first extended portion of the intermediate electrode MT may be extended to such an extent as to be close to the second storage line STL2 in the first pixel PIX1 and to be close to the first storage line STL1 in the second pixel PIX2.

[Seventh Embodiment]

In the above-described fifth and sixth embodiments, any of the protective films PAS is configured by laminating the organic protective film PAS2 on the inorganic protective film PAS1. However, the protective film PAS may be configured only of the inorganic protective film PAS1 without forming the organic protective film PAS2.

In the case of the first and second embodiments, as shown in FIG. 6 which is the cross-sectional view taken along line VI-VI of FIG. 1, the pixel electrode PX on the first pixel PIX1 side and the pixel electrode PX on the second pixel PIX2 side can be sufficiently overlapped with the drain signal line DL. This is because there is no need to consider a capacitance generated between the drain signal line DL and the pixel electrode PX caused by the formation of the organic protective film PAS2.

Figure 13:
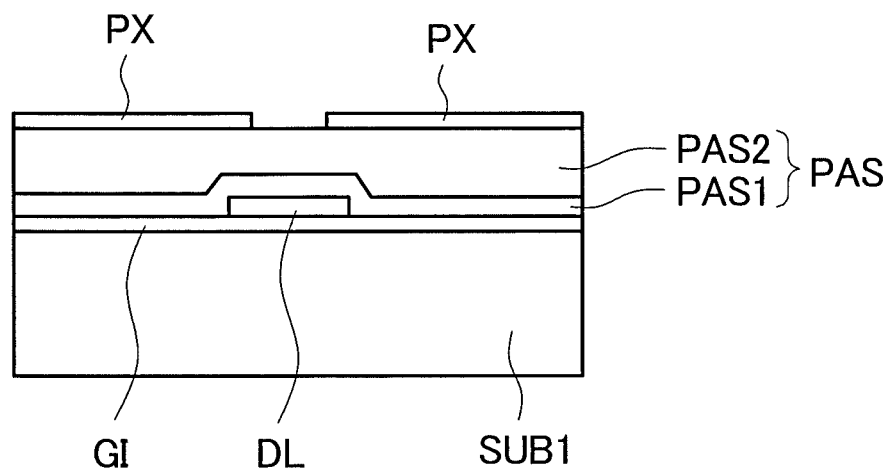
FIG. 13 is a cross-sectional view taken along line VI-VI of FIG. 8.
Figure 14:
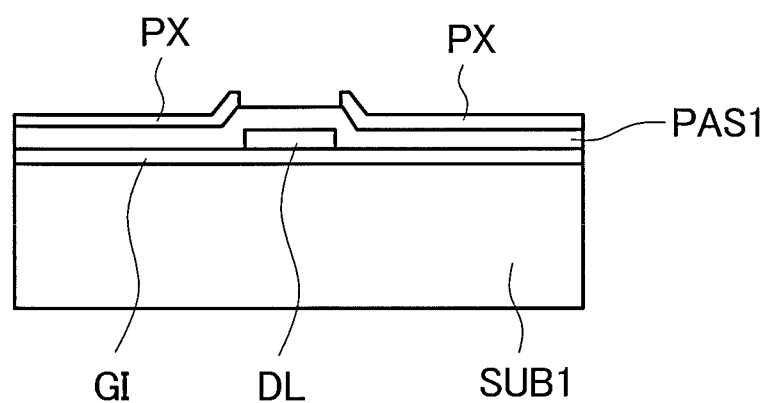
FIG. 14 is a cross-sectional view of the pixels showing the sixth embodiment of the liquid crystal display device of the invention.

However, when the protective film PAS is configured only of the inorganic protective film PAS1, as shown in FIG. 14 that corresponds to FIG. 13, it is sometimes difficult to form the pixel electrode PX on the first pixel PIX1 side and the pixel electrode PX on the second pixel PIX2 side so as to overlap with the drain signal line DL. Therefore, they have to be formed slightly apart from the drain signal line DL in a plan view. This slightly reduces the aperture ratio of the pixel. However, as to the above-described advantage due to the intermediate electrode MT, the aperture ratio of the pixel can be remarkably improved irrespective of the presence or absence of the organic protective film PAS2. Accordingly, the invention can also be applied to the case where the organic protective film PAS2 is not formed.

While the invention has been described by using the embodiments, the configurations described in the embodiments are illustrative only. The invention can be modified appropriately within a range not departing from the technical idea thereof. The configurations described in the embodiments may be used in any combination with each other unless they conflict with each other.

What is claimed is:

1. A display device comprising:
a first gate signal line and a second gate signal line;
a first drain signal line, a second drain signal line, and a third drain signal line;
a first pixel and a second pixel surrounded by the first gate signal line, the second gate signal line, the first drain signal line, and the second drain signal line, and a third pixel and a fourth pixel surrounded by the first gate signal line, the second gate signal line, the second drain signal line, and the third drain signal line; and
a first storage line and a second storage line disposed between the first gate signal line and the second gate signal line,
wherein the first pixel comprises a first thin film transistor connected to the first gate signal line, the first drain signal line, and a first pixel electrode of the first pixel,
wherein the second pixel comprises a second thin film transistor connected to the second gate signal line, the second drain signal line, and a second pixel electrode of the second pixel,
wherein the third pixel comprises a third thin film transistor connected to the second drain signal line and a third pixel electrode of the third pixel,
wherein the first storage line is disposed adjacent to the first thin film transistor and the second storage line is disposed adjacent to the second thin film transistor, and
wherein a third storage line is disposed between the first pixel electrode and the second pixel electrode, and connected to the first storage line and the second storage line.

2. A display device according to claim 1, wherein the first storage line has a region with a wide width in a portion thereof close to the first thin film transistor, and the second storage line has a range with a wide width in a portion thereof close to the second thin film transistor.

3. A liquid crystal display device according to claim 1, wherein an organic insulating film covers each of the thin film transistors, and each of the pixel electrodes are formed on the upper surface of the organic insulating film.

4. A display device according to claim 1, wherein the first pixel electrode and the second pixel electrode are overlapped with the third storage line.

5. A liquid crystal display device according to claim 4, wherein an organic insulating film covers each of the thin film transistors, and each of the pixel electrodes are formed on the upper surface of the organic insulating film.

6. A liquid crystal display device according to claim 1, wherein the fourth pixel comprises a fourth thin film transistor connected to the third drain signal line and a fourth pixel electrode of the fourth pixel, and
wherein a fourth storage line is disposed between the third pixel electrode and the fourth pixel electrode, and electrically connected to the first storage line and the second storage line.

7. A display device according to claim 6, wherein the first storage line has a region with a wide width in a portion thereof close to the first thin film transistor, and the second storage line has a region with a wide width in a portion thereof close to the second thin film transistor.

8. A liquid crystal display device according to claim 6, wherein an organic insulating film covers each of the thin film transistors, and each of the pixel electrodes are formed on the upper surface of the organic insulating film.

9. A display device according to claim 6, wherein the third pixel electrode and the fourth pixel electrode are overlapped with the fourth storage line.

10. A liquid crystal display device according to claim 9, wherein an organic insulating film covers each of the thin film transistors, and each of the pixel electrodes are formed on the upper surface of the organic insulating film.

11. A display device comprising:
a first gate signal line and a second gate signal line;
a first drain signal line, a second drain signal line, and a third drain signal line;
a first pixel and a second pixel surrounded by the first gate signal line, and second gate signal line, the first drain signal line, and the second drain signal line, and a third pixel and a fourth pixel surrounded by the first gate signal line, the second gate signal line, the second drain signal line, and the third drain signal line; and
a first storage line and a second storage line disposed between the first gate signal line and the second gate signal line;

wherein the first pixel comprises a first thin film transistor connected to the first gate signal line, the first drain signal line, and a first pixel electrode of the first pixel;

wherein the second pixel comprises a second thin film transistor connected to the second gate signal line, the second drain signal line, and a second pixel electrode of the second pixel;

wherein the third pixel comprises a third thin film transistor connected to the second drain signal line and a third pixel electrode of the third pixel;

wherein the first storage line is overlapped with the first pixel electrode, and the second storage line is overlapped with the second thin pixel electrode; and wherein a third storage line is disposed between the first pixel electrode and the second pixel electrode, and connected to the first storage line and the second storage line.

12. A display device according to claim 11, wherein the first pixel electrode and the second pixel electrode are overlapped with the third storage line.

13. A liquid crystal display device according to claim 12, wherein an organic insulating film covers each of the thin film transistors, and each of the pixel electrodes are formed over the upper surface of the organic insulating film.

14. A display device according to claim 11, wherein the first storage line has a region with a wide width in a portion thereof close to the first thin film transistor, and the second storage line has a region with a wide width in a portion thereof close to the second thin film transistor.

15. A liquid crystal display device according to claim 14, wherein an organic insulating film covers each of the thin film transistors, and each of the pixel electrodes are formed over the upper surface of the organic insulating film.

16. A liquid crystal display device according to claim 11, wherein the fourth pixel comprises a fourth thin film transistor connected to the third drain signal line and a fourth pixel electrode of the fourth pixel, and wherein a fourth storage line is disposed between the third pixel electrode and the fourth pixel electrode, electrically connected to the third line.

17. A display device according to claim 16, wherein the third pixel electrode and the fourth pixel electrode are overlapped with the fourth storage line.

18. A liquid crystal display device according to claim 17, wherein an organic insulating film covers each of the thin film transistors, and each of the pixel electrodes are formed over the upper surface of the organic insulating film.

19. A display device according to claim 16, wherein the first storage line has a region with a wide width in a portion thereof close to the first thin film transistor, and the second storage line has a region with a wide width in a portion thereof close to the second thin film transistor.

20. A liquid crystal display device according to claim 19, wherein an organic insulating film covers each of the thin film transistors, and each of the pixel electrodes are formed on the upper surface of the organic insulating film.

* * * * *